(12) United States Patent
Ito et al.

(10) Patent No.: US 11,356,063 B2
(45) Date of Patent: Jun. 7, 2022

(54) AMPLIFICATION APPARATUS AND METHOD

(71) Applicant: RENESAS ELECTRONICS CORPORATION, Tokyo (JP)

(72) Inventors: Takuya Ito, Tokyo (JP); Tomoumi Yagasaki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 91 days.

(21) Appl. No.: 16/850,826

(22) Filed: Apr. 16, 2020

(65) Prior Publication Data

US 2020/0382068 A1    Dec. 3, 2020

(30) Foreign Application Priority Data

May 28, 2019    (JP) .............................. JP2019-099501

(51) Int. Cl.
| | | |
|---|---|---|
| *H03F 1/02* | (2006.01) | |
| *H03F 3/72* | (2006.01) | |
| *H03F 3/24* | (2006.01) | |
| *H03F 3/195* | (2006.01) | |
| *H03F 3/21* | (2006.01) | |

(52) U.S. Cl.
CPC ......... *H03F 1/0277* (2013.01); *H03F 1/0222* (2013.01); *H03F 3/195* (2013.01); *H03F 3/211* (2013.01); *H03F 3/245* (2013.01); *H03F 3/72* (2013.01); *H03F 2200/102* (2013.01); *H03F 2200/318* (2013.01); *H03F 2200/432* (2013.01); *H03F 2200/451* (2013.01); *H03F 2203/7236* (2013.01)

(58) Field of Classification Search
CPC ...... H03F 1/0277; H03F 1/0222; H03F 3/195; H03F 3/211; H03F 3/245; H03F 3/72; H03F 2200/102; H03F 2200/318; H03F 2200/432; H03F 2203/7236; H03F 2200/451

USPC ........................................................ 330/295
See application file for complete search history.

(56) References Cited

U.S. PATENT DOCUMENTS 6,313,698 B1 *    11/2001    Zhang ................... H03F 1/0277
                                                              330/51
2004/0075501 A1    4/2004    Takahashi et al.

FOREIGN PATENT DOCUMENTS

JP    2004-140518 A    5/2004

OTHER PUBLICATIONS

Calvo, C., "The differential-signal advantage for communication system design", Design Lines, RF & Microwave Design line, published on Feb. 1, 2010 (Year: 2010).*

* cited by examiner

*Primary Examiner* — Hafizur Rahman
(74) *Attorney, Agent, or Firm* — McDermott Will & Emery LLP

(57) ABSTRACT

Amplification device and processes capable of miniaturization in a device for performing linear amplification and switching amplification operations on incoming signals are provided. The amplifying device includes a first amplifying unit for amplifying an input signal and outputting a first output signal, the input switch unit connected in parallel with the first amplifying unit for performing a switching operation by an input signal and outputting a switch output signal, and a second amplifying unit for amplifying a first output signal or a switch output signal and outputting a second output signal, and the first amplifying unit or the input switch unit operates based on the type of the input signal.

10 Claims, 26 Drawing Sheets

FIG. 5

| OPERATION | INPUT 1 | INPUT 2 | CONTROL 1 | OUTPUT |
|---|---|---|---|---|
| LINEAR AMPLIFICATION | AMPLITUDE MODULATION SIGNAL | LOW FIXED VOLTAGE | Vg1 | AMPLIFIED SIGNAL FOR INPUT 1 |
| SWITCHING AMPLIFICATION | NO SIGNAL | CONSTANT ENVELOPE SIGNAL | LOW FIXED VOLTAGE | AMPLIFIED SIGNAL FOR INPUT 2 |

FIG. 8

| OPERATION | INPUT 1 | INPUT 2 | CONTROL 1 | CONTROL 2 | OUTPUT |
|---|---|---|---|---|---|
| LINEAR AMPLIFICATION | AMPLITUDE MODULATION SIGNAL | LOW FIXED VOLTAGE | $Vg1$ | $Vg2$ | AMPLIFIED SIGNAL FOR INPUT 1 |
| SWITCHING AMPLIFICATION | NO SIGNAL | CONSTANT ENVELOPE SIGNAL | LOW FIXED VOLTAGE | $Vg3$ | AMPLIFIED SIGNAL FOR INPUT 2 |

FIG. 9
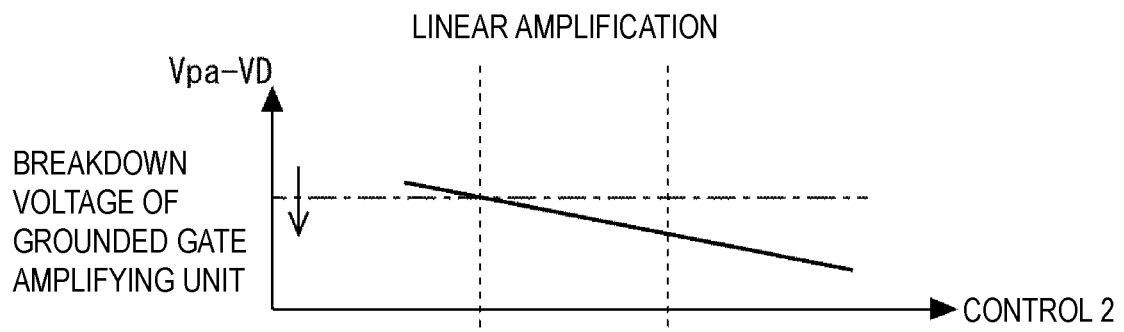
LINEAR AMPLIFICATION
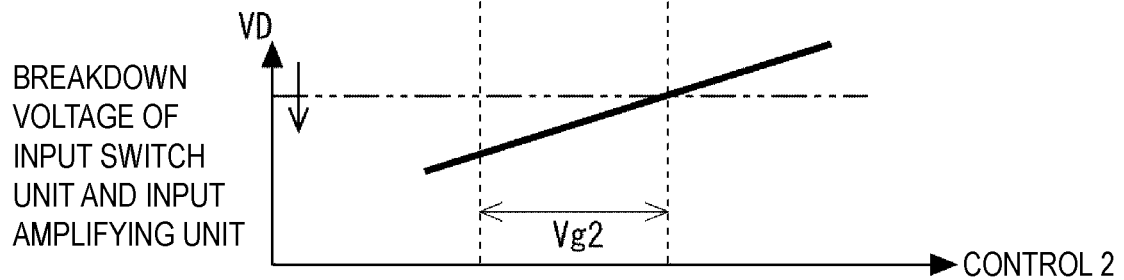
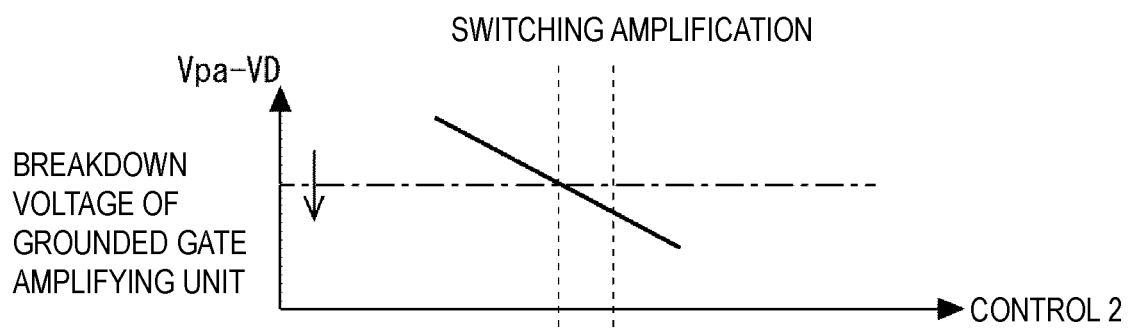
SWITCHING AMPLIFICATION
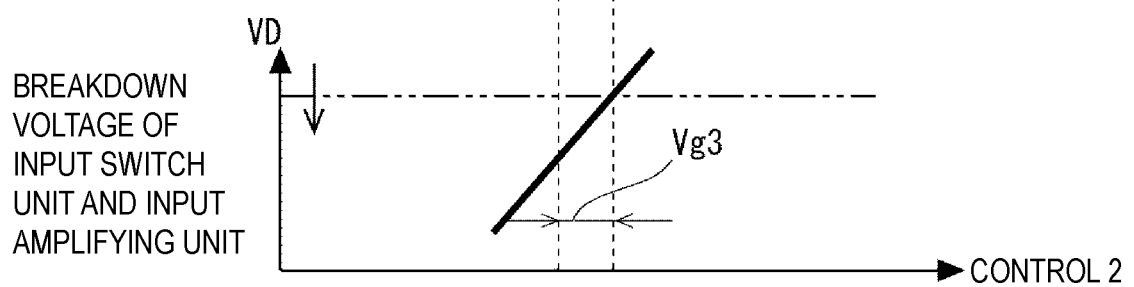

FIG. 14
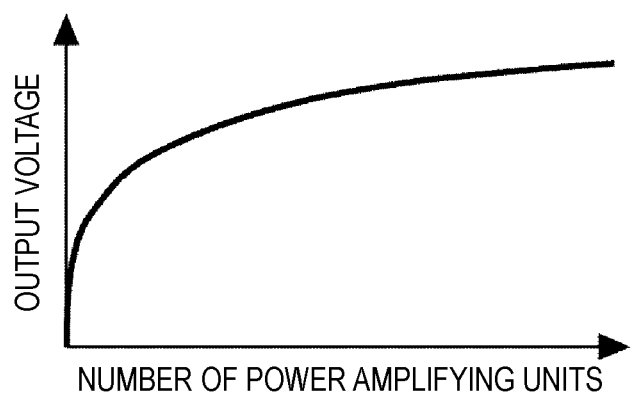
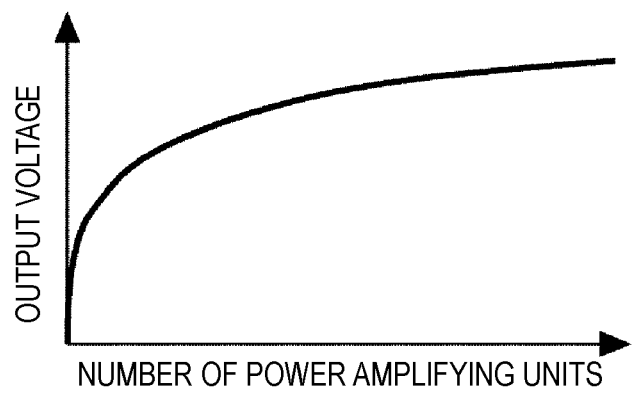

FIG. 16

| OPERATION | ON-UNIT | | | | OFF-UNIT | | | | OUTPUT |
|---|---|---|---|---|---|---|---|---|---|
| | INPUT 1 | INPUT 2 | CONTROL 1 | CONTROL 2 | INPUT 1 | INPUT 2 | CONTROL 1 | CONTROL 2 | |
| LINEAR AMPLIFICATION | AMPLITUDE MODULATION SIGNAL | LOW FIXED VOLTAGE | Vg1 | Vg2 | AMPLITUDE MODULATION SIGNAL | LOW FIXED VOLTAGE | LOW FIXED VOLTAGE | Vg2_off | AMPLIFIED SIGNAL FOR INPUT 1 |
| SWITCHING AMPLIFICATION | NO SIGNAL | CONSTANT ENVELOPE SIGNAL | LOW FIXED VOLTAGE | Vg3 | NO SIGNAL | LOW FIXED VOLTAGE | LOW FIXED VOLTAGE | Vg3_off | AMPLIFIED SIGNAL FOR INPUT 2 |

FIG. 17
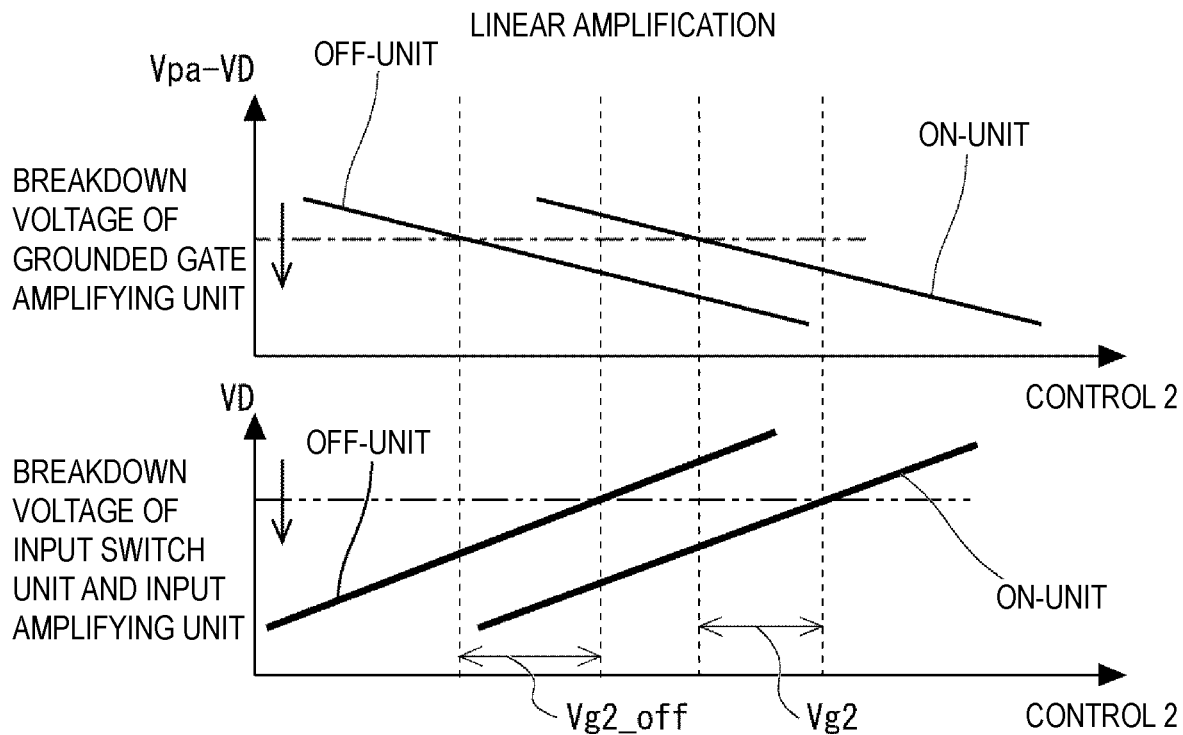
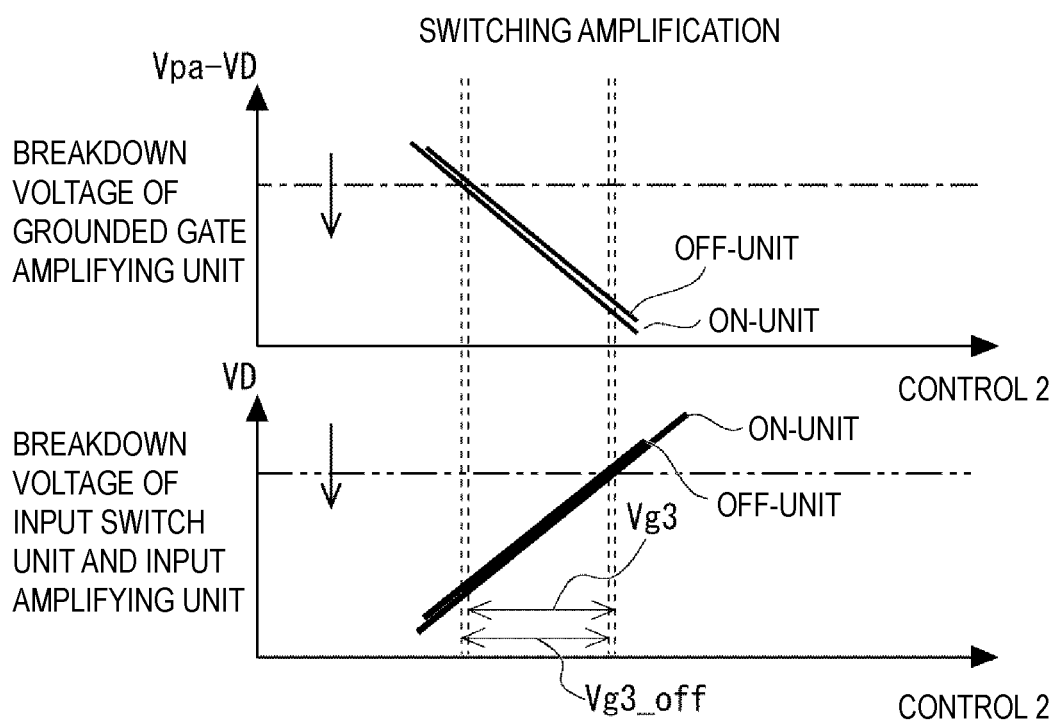

FIG. 20

| EN | IN2 | DRIVER OUTPUT | INPUT 2 STATUS |
|---|---|---|---|
| High | High | High | RF SIGNAL INPUT (H) |
| | Low | Low | RF SIGNAL INPUT (L) |
| Low | High | Low | INPUT SHUT OFF |
| | Low | Low | |

AMPLIFICATION APPARATUS AND METHOD

CROSS-REFERENCE TO RELATED APPLICATIONS

The disclosure of Japanese Patent Application No. 2019-099501 filed on May 28, 2019 including the specification, drawings and abstract is incorporated herein by reference in its entirety.

BACKGROUND

The present disclosure relates to an amplifier device and method, and, for example, to an amplifier device and method capable of miniaturization in a device for performing linear amplification and switching amplification operations on incoming signals.

In a radio transmission device using a radio frequency in the sub-gigahertz band targeting the power meter and smart grid markets, in order to expand the data rate, there has been a need to cope with a modulation system including not only a constant envelope modulation system typified by frequency modulation (FSK: Frequency Shift Keying) but also a amplitude modulation typified by OFDM/OQPSK (Orthogonal Frequency Division Multiplexing/Offset Quadrature Phase Shift Keying). The characteristics required to amplify the OFDM signal differ from the characteristics required to amplify the frequency-modulated signal. Therefore, it is generally required to add a separate transmit amplifier corresponding to the OFDM signals.

There are disclosed techniques listed below.
[Patent Document 1] Japanese Unexamined Patent Application Publication No. 2004-140518

Patent Document 1 discloses that an n-root conversion circuit or a logarithmic conversion circuit is provided between a current detection circuit and a current-voltage conversion circuit in an electronic component for high-frequency power amplification constituting a radio communication system which performs detection of an output level required for feedback control of output power by a current detection method and compares an output level detection signal and an output level instruction signal to generate a bias voltage of the high-frequency power amplification circuit in accordance with the difference and performs gain control. When the art disclosed in Patent Document 1 is used to cope with the amplitude modulation method and the constant envelope modulation method, a filtering for the amplifier, amplitude modulation method for the amplifier, constant envelope modulation method for the amplitude modulation method, a filtering for the constant envelope modulation method, and the like are required. Therefore, the chip area of the device used in the amplifier becomes large, and it is difficult to miniaturize the amplifier device.

SUMMARY

As described above, in case of the signal corresponds to the OFDM signal, since the transmitting amplifier corresponding to the OFDM signal needs to be added separately, there is a problem that it is difficult to miniaturize the amplifier device.

Other objects and novel features will become apparent from the description of this specification and the accompanying drawings.

According to one embodiment, the amplifier device comprises a first amplifying unit for amplifying an input signal and outputting a first output signal, an input switch unit connected in parallel with the first amplifying unit for performing a switching operation by the input signal and outputting a switch output signal, and a second amplifying unit for amplifying the first output signal or the switch output signal and outputting a second output signal. The first amplifying unit or the input switch unit operates based on a type of the input signal.

According to another embodiment, the amplifier device comprises a plurality of power amplifying circuits including the first amplifying unit, the input switch unit, and the second amplifying unit. All outputs of the plurality of power amplifier circuits are connected to an input of passive circuits. All inputs of the plurality of first amplifying units are connected to a first input terminal. Inputs of the plurality of input switch units are connected to a second input terminal provided for each of the plurality of input switch units. The number of operations of the first amplifying unit is controlled by a first control signal, and the number of operations of the second amplifying unit is controlled by a second control signal, when an amplitude modulation signal is input from the first input terminal. The input switch unit is operated by the constant envelope signal, and the number of operations of the second amplifying unit is controlled by the second control signal, when a constant envelope signal is input from the second input terminal. And the transmission power at the output terminal of the passive circuit is controlled to be a desired transmission power.

According to another embodiment, a method comprises amplifying an input signal and outputting a first output signal, switching operation is performed by the input signal, and outputting a switch output signal, and amplifying the first output signal or the switch output signal to output a second output signal based on a type of the input signal.

According to the above-mentioned embodiment, it is possible to provide an amplifier device and a method which can be miniaturized in a device for performing a linear amplification operation and a switching amplification operation on an input signal.

BRIEF DESCRIPTION OF THE DRAWINGS

FIG. 5 is a diagram illustrating a setting of the amplifier device according to the first embodiment.
FIG. 8 is a diagram illustrating a setting of the amplifier device according to the second embodiment.
FIG. 9 is a graph illustrating a relationship between a voltage of a control 2 and a voltage of an output D1 of the amplifier device according to the second embodiment.

FIG. 14 is a graph illustrating the output power of the amplifier device according to the fourth embodiment.

FIG. 16 is a diagram illustrating a setting of the amplifier device according to the fourth embodiment.

FIG. 17 is a graph illustrating a relationship between the voltage of the control 2 and the voltage of the output D1 of according to the amplifier device according to the fourth embodiment.

FIG. 20 is a diagram illustrating a setting of the amplifier device according to the fifth embodiment.

DETAILED DESCRIPTION

Figure 1:
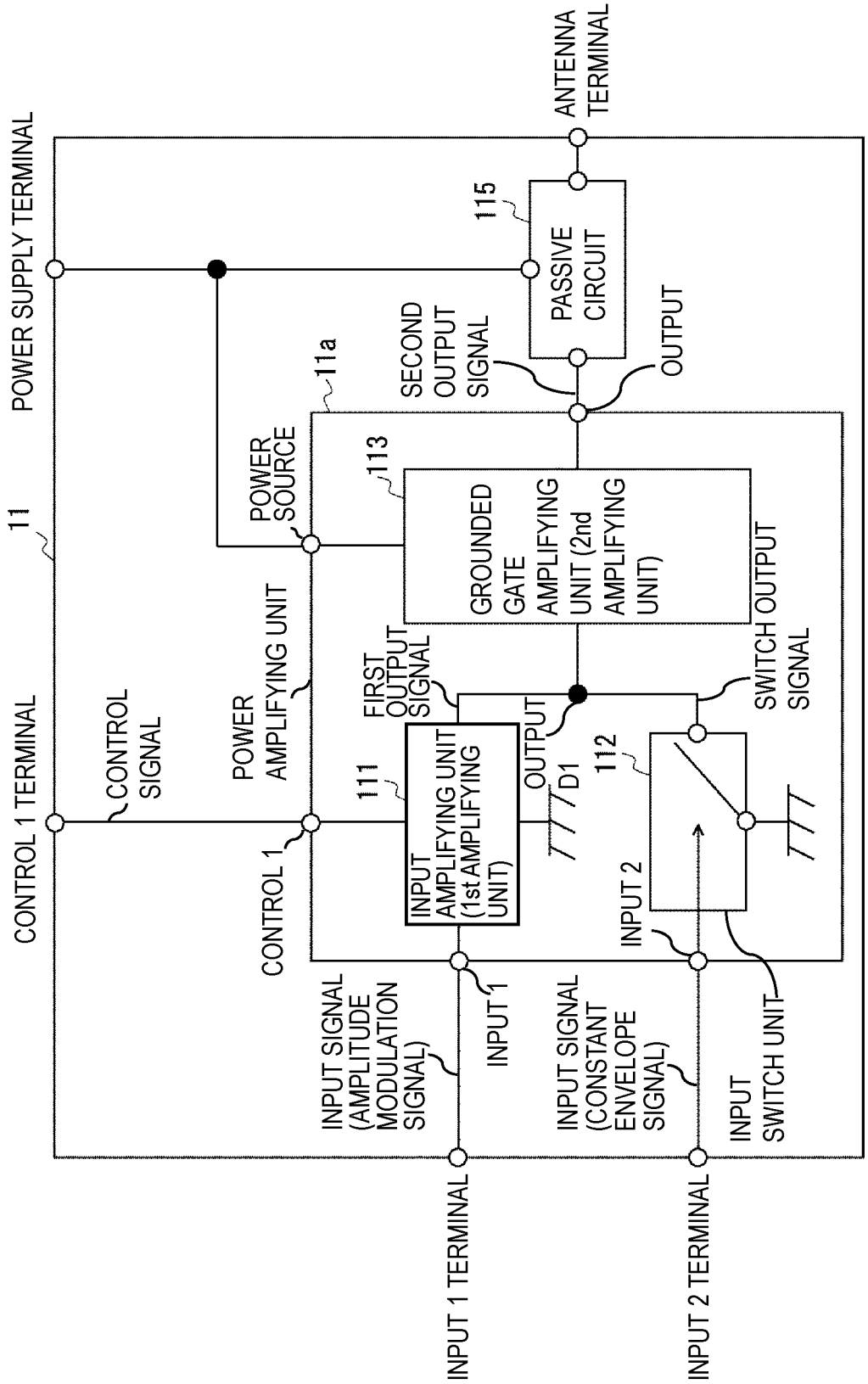
FIG. 1 is a block diagram illustrating an amplifier device according to a first embodiment.

For clarity of explanation, the following description and drawings are appropriately omitted and simplified. In addition, the elements described in the drawings as functional blocks for performing various processes can be configured as CPUs (Central Processing Unit), memories, and other circuits in terms of hardware, and are realized by programs loaded into the memories in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the programs described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

First Embodiment

A first embodiment according to an amplifier device is outlined. FIG. 1 is a block diagram illustrating the amplifier device according to the first embodiment.

As shown in FIG. 1, the amplifier device 11 according to the first embodiment includes a power amplifying unit 11a and a passive circuit 115. The power amplifying unit 11a includes an input amplifying unit 111, an input switch unit 112, and a grounded gate amplifying unit 113.

The input amplifying unit may be referred to as a first amplifying unit. The grounded gate amplifying unit may be referred to as a second amplifying unit. The passive circuit may also be referred to as a matching circuit. The power amplifying unit may be referred to as a power amplifier unit.

The input amplifying unit 111 amplifies an input signal input via an input 1 terminal and outputs a first output signal.

The input switch unit 112 is connected in parallel with the input amplifying unit 111, performs a switching operation by an input signal input through an input 2 terminal, and outputs a switch output signal. The switching operation means, for example, controlling the opening and closing of a switch.

The first output signal, which is the output of the input amplifying unit 111, and the switch output signal, which is the output of the input switch unit 112, are connected and input to the grounded gate amplifying unit 113. A connection point at which the first output signal and the switch output signal are connected is referred to as the output D1.

The grounded gate amplifying unit 113 amplifies the first output signal or the switch output signal and outputs a second output signal.

The second output signal is input to the passive circuit 115. The passive circuit 115 is the passive circuit for matching the second output signal.

The input amplifying unit 111 or the input switch unit 112 operates based on the type of the input signal. The amplifier device 11 controls a state in which the input amplifying unit 111 is operated to stop the input switch unit 112 and a state in which the input switch unit 112 is operated to stop the input amplifying unit 111 based on an input signal input to the input 1 terminal, an input signal input to the input 2 terminal, and a control signal input to the control 1 terminal.

Specifically, when the type of the input signal is the amplitude modulation signal, the input amplifying unit 111 operates, and the input switch unit 112 stops operation. Accordingly, when the input signal is an amplitude modulation signal, the amplifier device 11 outputs the first output signal from the input amplifying unit 111, and does not output the switch output signal from the input switch unit 112. That is, while the input amplifying unit 111 operates, the input switch unit 112 stops its operation.

When the type of the input signal is the constant envelope signal, the input switch unit 112 operates, and the first amplifying unit 111 stops the operation. Thus, when the input signal is a constant envelope signal, the amplifier device 11 does not output the first output signal from the input amplifying unit 111, but outputs the switch output signal from the input switch unit 112. That is, while the input switch unit 112 operates, the input amplifying unit 111 stops operation.

By this exclusive operation, the power amplifying unit 11a can be provided a linear amplification operation for amplifying the input signal to be input to the input 1 terminal to A-class or AB-class, and a switching amplification operation for amplifying the input signal to be input to the input 2 terminal to E-class.

Since the amplifier device 11 according to the first embodiment can share the passive circuit 115 according to the linear amplification operation and the switching amplification operation, the amplifier device 11 can be miniaturized. In other words, according to the present first embodiment, it is possible to provide the amplifier device and a method which can be miniaturized in a device for performing a linear amplification operation and a switching amplification operation on an input signal.

Since the first embodiment according to the amplifier device 11 shares the passive circuit 115, it is possible to reduce the area of chips of components, consume less current, and reduce costs.

The first embodiment according to the amplifier device 11 can suppress the deterioration of the characteristics of each of the linear amplification operation and the switching amplification operation by dividing the input amplifying unit 111 and the input switch unit 112. As a result, it is possible to prevent deterioration of power efficiency of the amplifying section and aging due to device withstand voltage.

Figure 2:
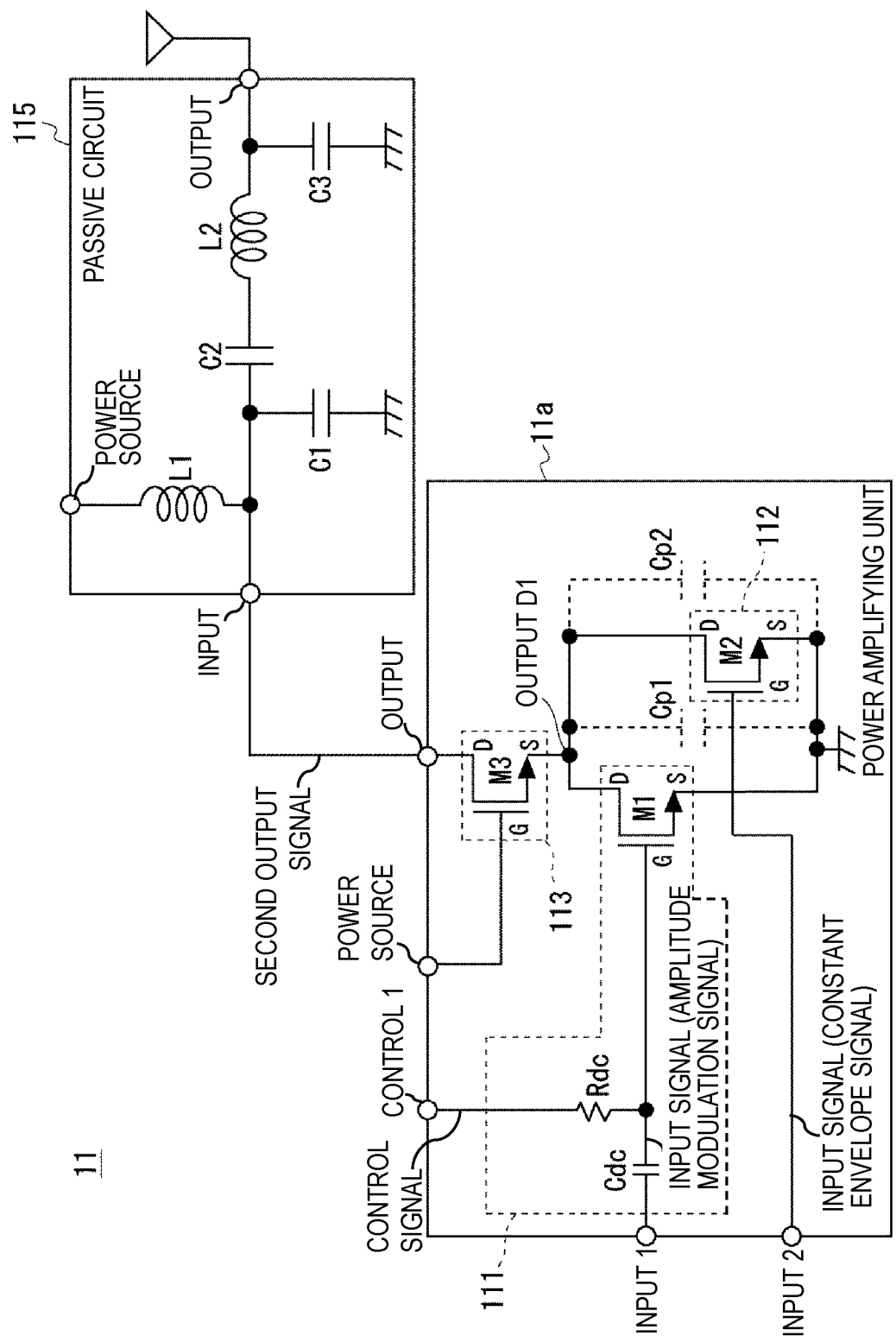
FIG. 2 is a circuit diagram illustrating the amplifier device according to the first embodiment.
Figure 3:
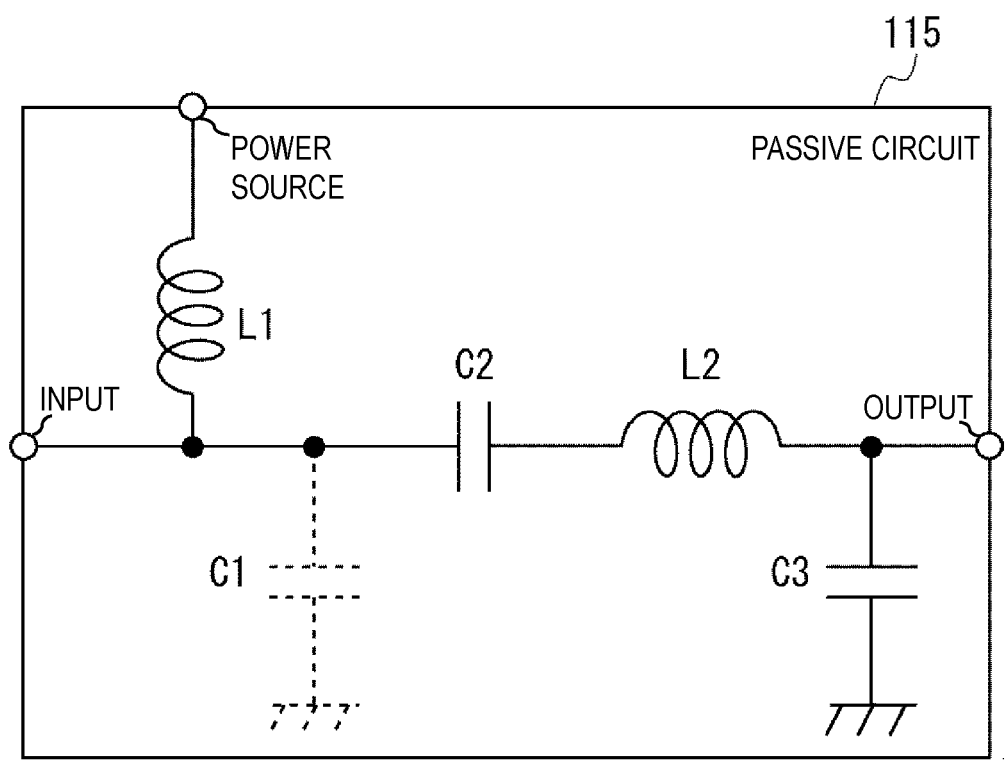
FIG. 3 is a circuit diagram illustrating a passive circuit according to the first embodiment.
Figure 4:
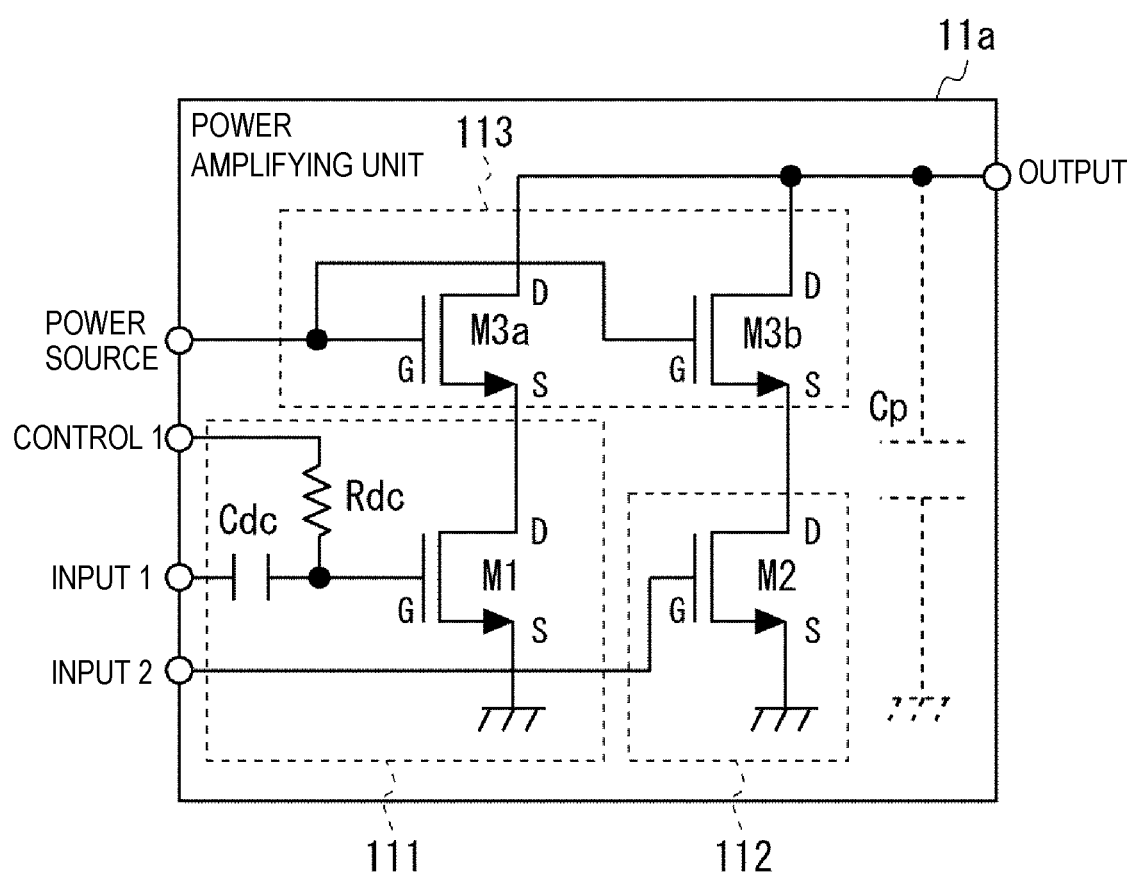
FIG. 4 is a circuit diagram illustrating the amplifier device according to the first embodiment.

First embodiment according to the amplifier device is described in detail. FIG. 2 is a circuit diagram illustrating the amplifier device according to the first embodiment. FIG. 3 is a circuit diagram illustrating a first embodiment according to passive circuit. FIG. 4 is a circuit diagram illustrating the amplifier device according to the first embodiment.

As shown in FIG. 2, the input amplifying unit 111 of the first embodiment according to power amplifying unit 11a includes a transistor M1, a capacitor element Cdc, and a resistive element Rdc. The input switch unit 112 includes a transistor M2. The grounded gate amplifying unit 113 includes a transistor M3.

A source S of the transistor M1 of the input amplifying unit 111 is grounded, the input signal input from an input 1 is connected to a gate G of the transistor M1 via the capacitor element Cdc, and the control signal input from a control 1 is connected to the gate G of the transistor M1 via the resistive element Rdc.

An input signal input from the input 2 terminal is connected to a gate G of the transistor M2. The source S of the transistor M1 and a source S of the transistor M2 are connected to the ground.

A drain D of the transistor M1 and a drain D of the transistor M2 are connected to a source S of the transistor M3. The transistor M3 outputs the second output signal from a drain D, and the second output signal is inputted to the passive circuit 115.

When the input signal is the amplitude modulation signal, a first predetermined voltage Vg1 is applied to the gate G of the transistor M1, the input amplifying unit 111 operates, and the low-level voltage is applied to the gate G of the transistor M2, and the input switch unit 112 stops operation. As a result, the first output signal is output from the input amplifying unit 111, and the switch output signal is not output from the input switch unit 112.

When the input signal is a constant envelope signal, a low-level voltage is applied to the gate G of the transistor M1, the input amplifying unit 111 stops operation, and the input switch unit 112 operations. Thus, the switch output signal is output from the input switch unit 112, and the first output signal is not output from the input amplifying unit 111.

The transistor M1 may be referred to as a first transistor, the transistor M2 may be referred to as a second transistor, and the transistor M3 may be referred to as a third transistor.

In FIG. 2, a parasitic capacitance of the transistor M1 is shown as a parasitic capacitance Cp1. The parasitic capacitance of the transistor M2 is shown as the parasitic capacitance Cp2. The passive circuit 115 includes an inductive element L1 that functions as a power supply and a load, the capacitor element C1, the capacitor element C2, a capacitor element C3, and an inductive element L2. The passive circuit 115 is a matching circuit that performs matching and waveform shaping. The configuration of the circuit responsible for waveform shaping can be freely changed in accordance with specifications required for the system, for example, a regulation value of unnecessary radiation. Power sources of the power amplifying unit 11a and the passive circuit 115 are connected to a power supply terminal of the amplifier device 11 and supplied with power.

FIG. 3 is a circuit diagram illustrating a minimum configuration of the passive circuit. The capacitor element C1 can be substituted by the parasitic capacitance Cp1 and the parasitic capacitance Cp2 shown in FIG. 2. Therefore, the capacitor element C1 of the passive circuit 115 may be omitted as shown in FIG. 3.

The power amplifying unit 11a may be replaced with a circuit shown in FIG. 4, which is different from the circuit shown in FIG. 2. That is, the input amplifying unit 111 includes the transistor M1, the input switch unit 112 includes the transistor M2, and the grounded gate amplifying unit 113 includes a linear amplification transistor M3a and a switching amplification transistor M3b.

An input signal input from the input 1 terminal is connected to the gate G of the transistor M1. An input signal input from the input 2 terminal is connected to the gate G of the transistor M2. The source S of the transistor M1 and source S of the transistor M2 are connected to the ground.

The drain D of the transistor M1 is connected to a source S of the linear amplification transistor M3a. The drain D of the transistor M2 is connected to a source S of the switching amplification transistor M3b.

A drain D of the linear amplification transistor M3a is connected to the drain D of the switching amplification transistor M3b. The second output signal is output from the drain D of the linear amplification transistor M3a.

The operation of the amplifier device 11 according to the first embodiment will now be described. Here, the operation of the circuit shown in FIG. 2 will be described. FIG. 5 is a diagram illustrating the setting of the amplifier device according to the first embodiment.

The power amplifying unit 11a shown in FIG. 2 performs an amplifying operation by two different operations, namely, a "linear amplification operation" by the input amplifying unit 111 and the grounded gate amplifying unit 113 and a "switching amplifying operation" by the input switch unit 112 and the grounded gate amplifying unit 113.

The "linear amplification operation" refers to an operation of linearly amplifying input signals, such as class A amplification and class AB amplification, for example. The "switching amplification operation" refers to an operation of efficiently taking out an amplified signal by utilizing a transient phenomenon of a switch controlled by an input signal, for example, class E amplification.

The amplifier device 11 performs the "linear amplification operation" and the "switching amplification operation" by setting as shown in FIG. 5 to the input 1, an input 2, and the control 1 shown in FIG. 2.

When linear amplification is performed, the amplifier device 11 inputs a modulated signal, amplitude modulation signal, with amplitude modulation at the input 1. The amplifier device 11 applies a low-level voltage to the input 2 to turn off the operation of the input switch unit 112. At this time, since the drain D of the transistor M2 is in the high impedance state, the operation of the transistor M1 is not affected. The low-level voltage is sometimes referred to as the low-level voltage or Low fixed voltage.

The amplifier device 11 applies the first predetermined voltage Vg1, which is a predetermined bias voltage required for the transistor M1 to perform the class A amplifying operation or the class AB amplifying operation, to the control 1.

The amplifier device 11 performs the setting of the linear amplification operation shown in FIG. 5 to amplify the input signal input from the input 1 terminal by the linear amplification operation, and outputs the amplified signal for the input 1.

The amplifier device 11 inputs constant envelope signals to the input 2 when performing switching amplification. The amplifier device 11 does not input a signal to the input 1, no signal, and applies a low-level voltage to the control 1 to turn off the operation of the input amplifying unit 111. At this time, since the drain D of the transistor M1 is in the high impedance state, it does not affect the operation of the transistor M2.

The amplifier device 11 amplifies the input signal input from the input 2 terminal by the switching amplifying operation and outputs the amplified signal to the input 2, by setting of the switching amplifying operation shown in FIG. 5.

The first embodiment according to the amplifier device 11 is divided into the input amplifying unit 111 and the input switch unit 112, and each performs an amplifying operation.

Thus, the potential of the output D1 when the power amplifying unit 11a performs linear amplification is determined by the voltage of the gate G of the grounded gate amplifying unit 113, the operation with reference to a certain potential. Therefore, the operation of the power amplifying unit 11a becomes stable operation, less susceptible to the influence of the parasitic capacitance, it is possible to reduce the characteristic deterioration.

In addition, since the input amplifying unit 111 and the input switch unit 112 can be individually designed, the balance between the transmission characteristics and the power efficiency can be optimized.

In addition, since the passive circuit 115 serving as a load is shared, the chip area of the component can be reduced. As a result, the amplifier device 11 can be miniaturized.

Second Embodiment

Figure 6:
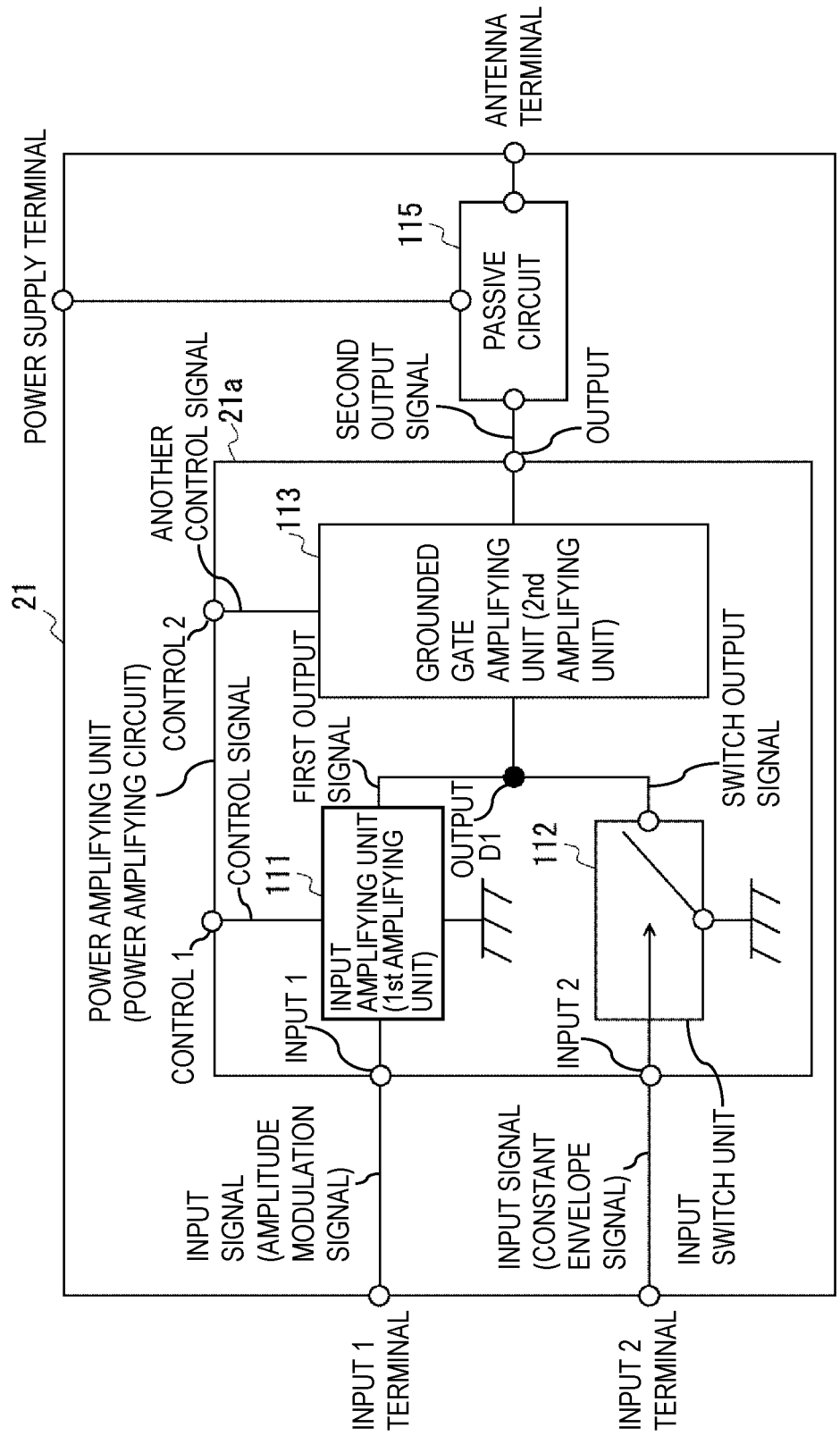
FIG. 6 is a block diagram illustrating the amplifier device according to a second embodiment.
Figure 7:
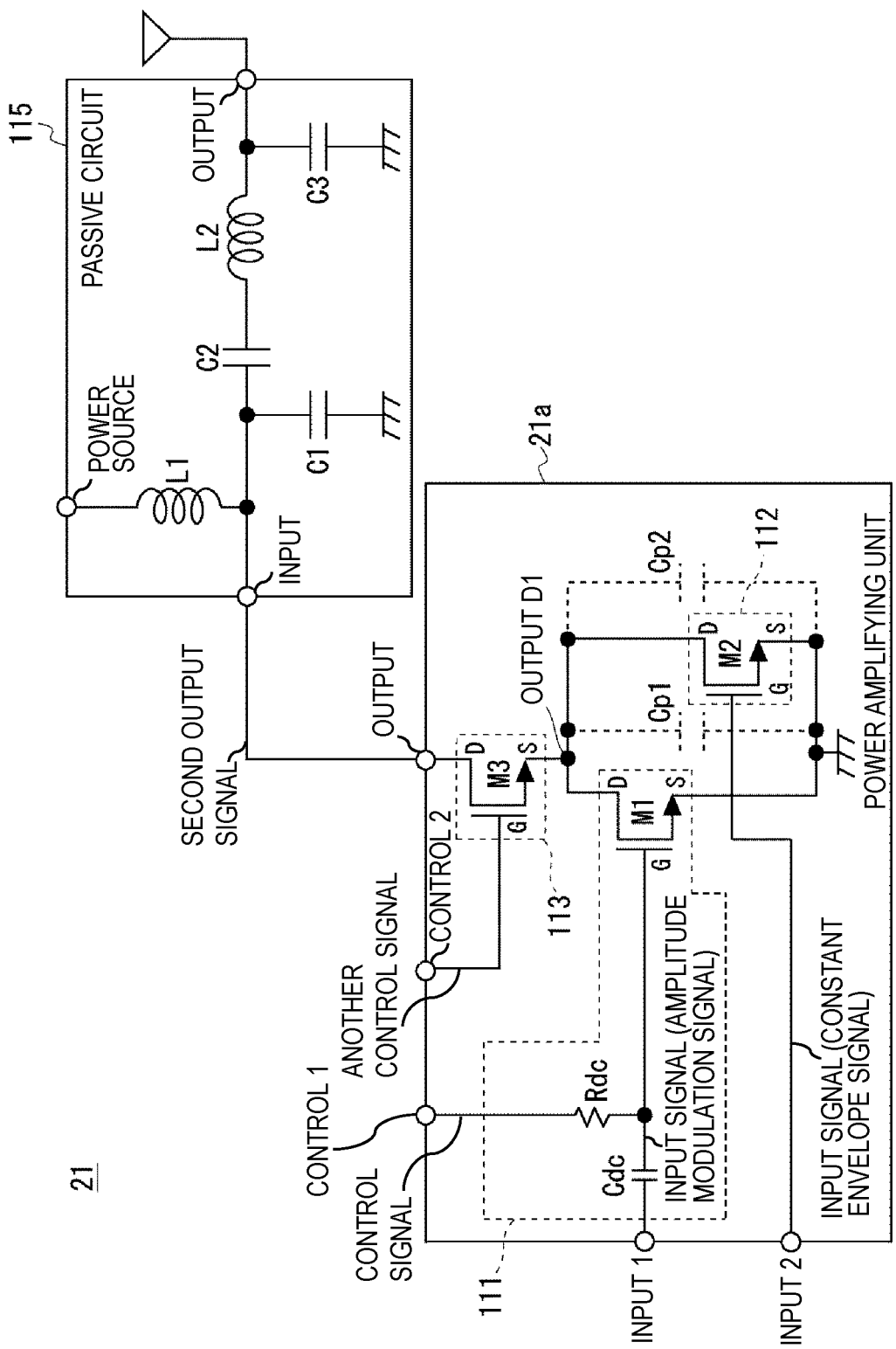
FIG. 7 is a circuit diagram illustrating the amplifier device according to the second embodiment.

FIG. 6 is a diagram illustrating the amplifier device according to the second embodiment. FIG. 7 is a circuit diagram illustrating the amplifier device according to the second embodiment. FIG. 8 is a diagram exemplifying the setting of the second embodiment according to power amplifying unit; FIG. 9 is a diagram illustrating a relationship between the voltage of the control 2 and the voltage of the output D1 of the amplifier device according to the second embodiment.

As shown in FIG. 6, the amplifier device 21 according to the second embodiment differs from the amplifier device 11 according to the first embodiment in that another control signal is applied to the grounded gate amplifying unit 113 via the control 2.

More specifically, as shown in FIG. 7, the another control signal is applied to the gate G of the transistor M3 of the grounded gate amplifying unit 113 via the control 2, thereby preventing the device from being damaged from a peak voltage signal generated during the switching amplifying operation. That is, by providing the gate G of the transistor M3 with a voltage value different from the voltage value at the time of the linear amplification operation, it is possible to suppress the peak voltage value at the output D1 to be equal to or less than the element breakdown voltage threshold value, and to prevent the element of the input amplifying unit 111 and the element of the input switch unit 112 from being destroyed.

The operation other than the operation related to the control 2 of the amplification device 21 according to the second embodiment is the same as the operation of the amplifier device according to the first embodiment, and therefore the description thereof is omitted.

As shown in FIG. 8, when the amplifier device 21 performs switching amplification, a third predetermined voltage Vg3, which is an analogue voltage required for the gate-grounded amplification operation of the transistor M3, is applied to the control 2 as another control signal. At this time, at the output D1 connected to the drain D of the transistor M1 and connected to the drain D of the transistor M2, the third predetermined voltage Vg3 is set (selected) so long as the peak voltage does not exceed the element breakdown voltage thresholds of the transistors M1 and M2. The third predetermined voltage Vg3 is applied to the gate G of the grounded gate amplifying unit 113 via the control 2.

Accordingly, the peak voltage (voltage at the output D1) at the drain D of the transistor M1 of the input amplifying unit 111 and the drain D of the transistor M2 of the input switch unit 112, during linear amplification operation and switching amplification operation, it is possible to prevent exceeding the element breakdown voltage threshold.

Here, the voltage at the output D1 is taken as the voltage VD, the AC component appearing at the voltage VD is taken as the voltage Vac, and the voltage of the second output signal which is the output signal of the power amplifying unit 11a is taken as the voltage Vpa. At this time, the peak voltage Vpeak of the voltage VD can be expressed as Vpeak=Vac+Vg3−Vth3. Note that Vth3 represents the threshold voltage of the transistor M3.

The amplifier device 21 can control the peak voltage Vpeak so as not to exceed the element breakdown voltage thresholds of the transistors M1 and M2 by decreasing the third predetermined voltage Vg3.

On the other hand, the breakdown voltage of the transistor M3 needs to be considered. The voltage between the drain D and the source S of the transistor M3 is at most Vpa−Vpeak. Since the peak voltage of the transistor M1 and the transistor M2 are inversely proportional as shown in FIG. 9, the transistor M1, the transistor M2, and the transistor M3 are optimally controlled so as not to exceed the element breakdown voltage thresholds.

When the amplifier device 21 performs the linear amplification operation, the voltage of a second predetermined voltage Vg2 is selected in the same manner as in the switching amplification operation. Since the AC-component of the voltage appearing at the output D1 during the linear amplification operation is generally smaller than the AC-component of the voltage Vac during the switching operation, the second predetermined voltage Vg2 can be increased.

Since the gain of the power amplifying unit 21a during the linear amplification operation can be increased by increasing the second predetermined voltage Vg2, the second predetermined voltage Vg2 is often larger than the third predetermined voltage Vg3. As a result, the value of the control 2 differs between the linear amplification and the switching amplifier, and the power supply voltage value is equal to or greater than Vg2 is equal to or greater than Vg3.

The operation of the amplifier device 21 according to the second embodiment is summarized as follows. In the amplifier device 21, when the input signal is an amplitude modulation signal, the first predetermined voltage Vg1 is applied to the gate G of the transistor M1 to operate the input amplifying unit 111, and the second predetermined voltage Vg2 is applied to the gate G of the transistor M3 to operate the grounded gate amplifying unit 113. In the amplifier device 21, a low-level voltage is applied to the gate G of the transistor M2, and the input switch unit 112 stops its operation.

When the input signal is a constant envelope signal, the low-level voltage is applied to the gate G of the transistor M1, and the input amplifying unit 111 stops the operation of the amplifier device 21. In the amplifier device 21, the third predetermined voltage Vg3 lower than the second predetermined voltage Vg2 is applied to the gate G of the transistor M3 to operate the input switch unit 112 and the grounded gate amplifying unit 113.

For the purpose of improving the power efficiency of the power amplifying unit 21a, the transistor having a high transconductance gm and a small parasitic capacitance, a so-called thin film transistor, may be used as the transistor M1 and the transistor M2.

Third Embodiment

Figure 10:
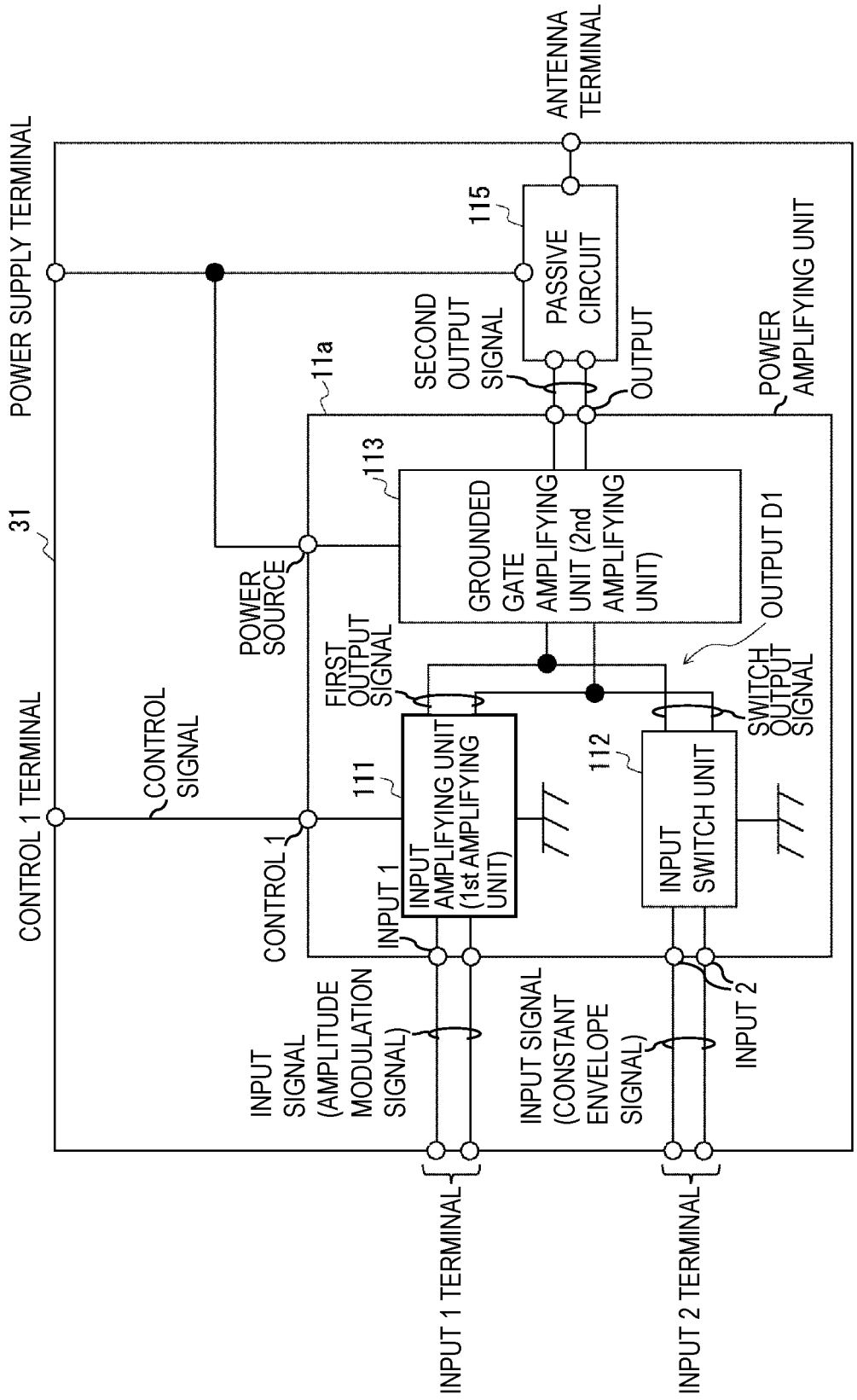
FIG. 10 is a block diagram illustrating the amplifier device according to a third embodiment.
Figure 11:
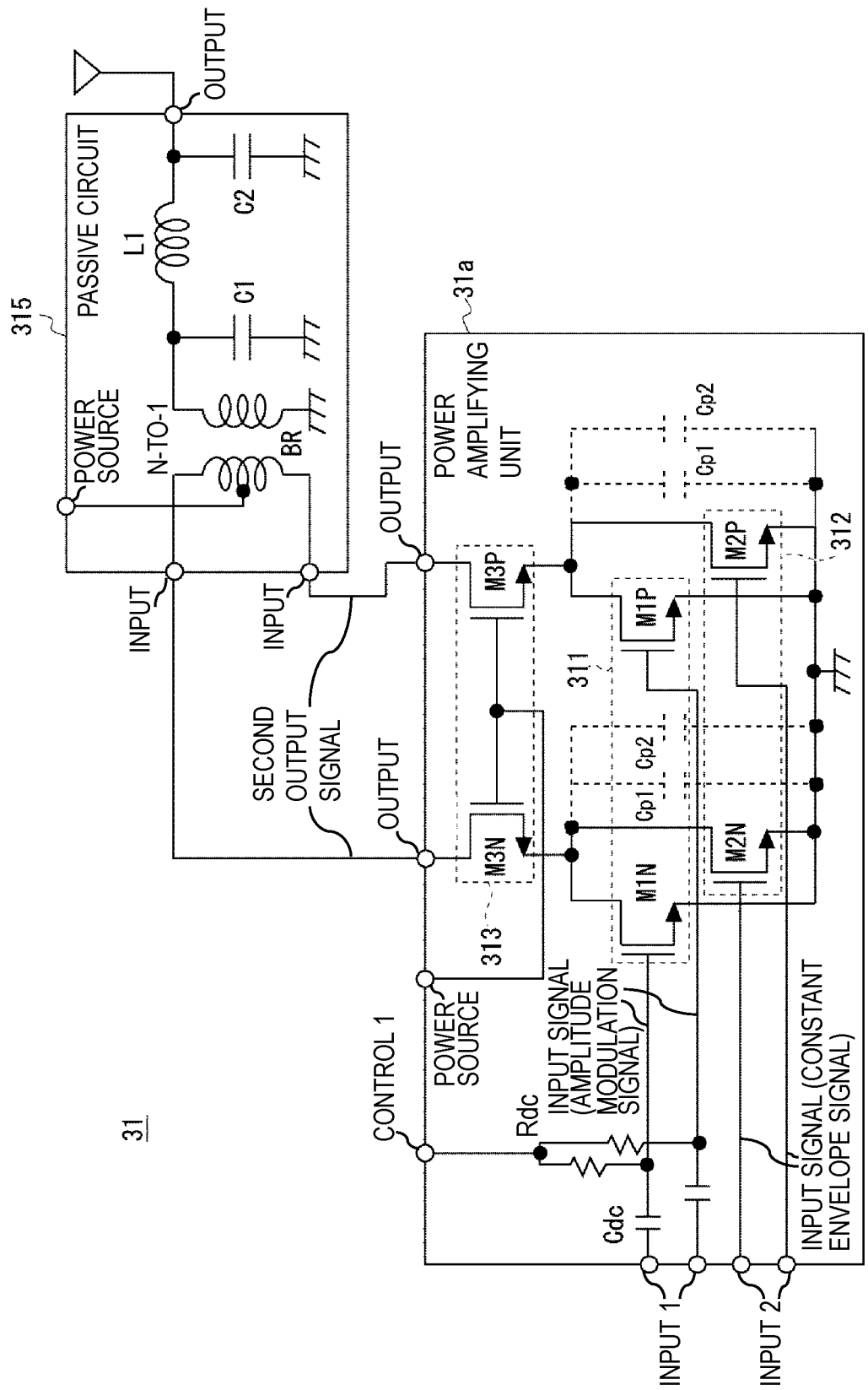
FIG. 11 is a circuit diagram illustrating the amplifier device according to the third embodiment.

FIG. 10 is a block diagram illustrating amplifier device according to a third embodiment. FIG. 11 is a circuit diagram illustrating the amplifier device according to the third embodiment.

As shown in FIGS. 10 and 11, the amplifier device 31 according to the third embodiment differs from the amplifier device 11 according to the first embodiment in that it corresponds to differential signals. In the amplifier device 31, the input signal, the first output signal, the switching output signal, and the second output signal are differential signals.

As shown in FIG. 10, the power amplifying unit 31a corresponds to a differential signal by configuring components in a differential pair.

The input amplifying unit 311 includes a transistor M1N and a transistor M1P for corresponding to a differential input signal. The input switch unit 312 includes a transistor M2N and a transistor M2P for corresponding to a differential input signal.

The grounded gate amplifying unit 313 includes a transistor M3N and a transistor M3P for amplifying the differential signal. The differential output of the power amplifying unit 31a is a drain D of the transistor M3N and a drain D of the transistor M3P, and is connected to the input of the passive circuit 315.

The passive circuit 315 includes a balun BR of N-to-1 for converting a differential signal into a single signal, the capacitor element C1, the capacitor element C2, and the inductive element L1. Where N is a natural number. The middle point of the primary side of the balun BR is connected to a power source for supplying power to the power amplifying unit 31a.

The amplifier device 31 according to the third embodiment can cancel even harmonic signals by adopting a differential configuration. Also, the amplifier device 31 can output a higher power than a single output.

Fourth Embodiment

Figure 12:
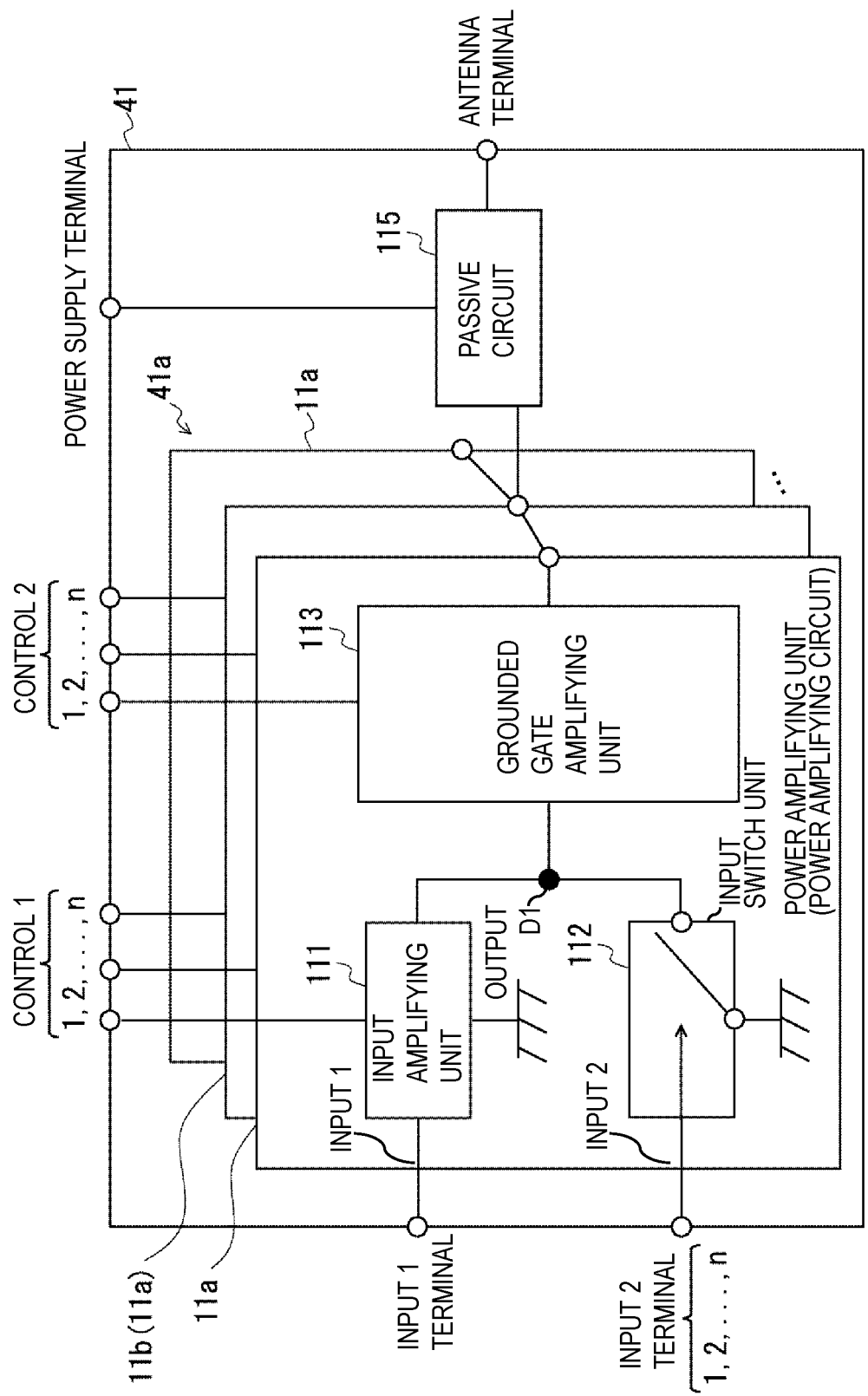
FIG. 12 is a block diagram illustrating the amplifier device according to a fourth embodiment.
Figure 13:
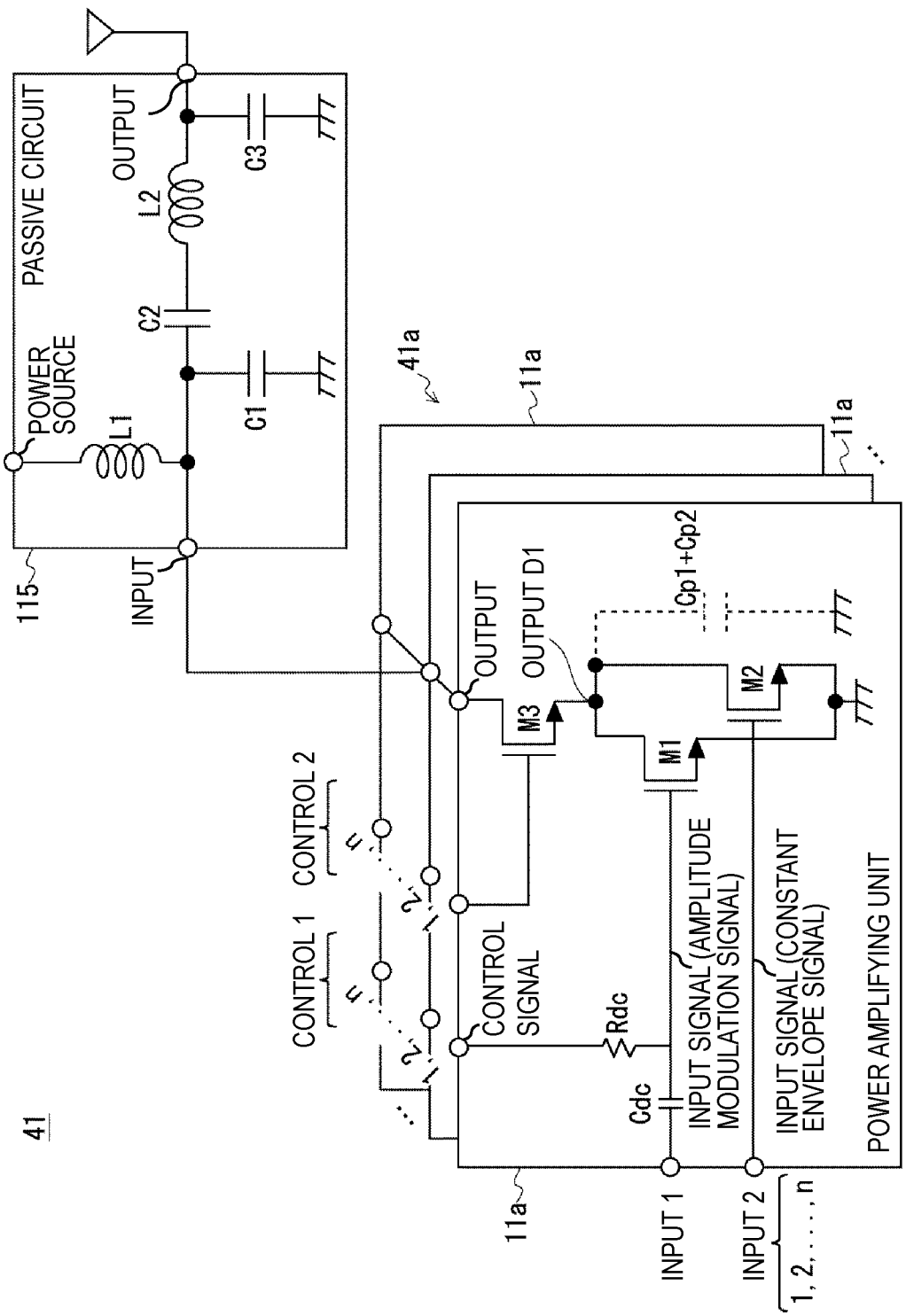
FIG. 13 is a circuit diagram illustrating the amplifier device according to the fourth embodiment.

FIG. 12 is a block diagram illustrating the amplifier device according to a fourth embodiment. FIG. 13 is a circuit diagram illustrating the amplifier device according to the fourth embodiment. FIG. 14 is a graph illustrating a power of the amplifier device according to the fourth embodiment. In FIG. 14, the horizontal axis represents the number of power amplifying units in the operation state, and the vertical axis represents the output power.

As shown in FIG. 12, the amplifier device 41 according to the fourth embodiment differs from the amplifier device 11 according to the first embodiment in that the gain of the power amplifying unit 41a is adjusted to control the transmit power from the power amplifying unit 41a.

The amplifier device 41 includes the plurality of power amplifying units 11a each having the input amplifying unit 111, the input switch unit 112, and the grounded gate amplifying unit 113. The plurality of power amplifying units 11a are collectively referred to as the power amplifying unit 41a. All the outputs of the plurality of power amplifying units 11a, that is, the outputs of the power amplifying unit 41a are connected to the inputs of the passive circuit 115. All the inputs of the plurality of input amplifying unit 111, that is, the inputs of the power amplifying unit 41a are connected to a first input terminal. The inputs of the plurality of input switch units 112 are connected to the second input terminal provided for each of the plurality of input switch units 112. The input 1 terminal may be referred to as a first input terminal. The input 2 terminal may be referred to as a second input terminal. The power amplifying unit is sometimes referred to as a power amplifying circuit.

In case of the amplitude modulation signal is input to the input 1 terminal of the amplifier device 41, the number of operations of the input amplifying units 111 are controlled by the first control signal input from a control 1 terminal, and the number of operations of the grounded gate amplifying units 113 are controlled by the second control signal input from a control 2 terminal.

In case of the constant envelope signal is input to the input 2 terminal of the amplifier device 41, the input switch unit 112 is operated by the constant envelope signal, and the number of operations of the grounded gate amplifying units 113 is controlled by the second control signal input from the control 2 terminal. The number of switches to be opened and closed varies depending on the constant envelope signals.

Amplifier device 41 controls such that the transmitting power at the output terminal of the passive circuit 115 is the desired transmitting power.

The amplifier device 41 according to the fourth embodiment is outlined. The power amplifying unit 41a connects a plurality of power amplifying units 11a in parallel, and shares all the outputs and all the inputs 1 of all the power amplifying units 11a. The input 2, the control 1, and the control 2 of each of the plurality of power amplifying units 11a are independent. A transistor size of each of the plurality of power amplifying units 11a may have a single size or may be weighted. In FIG. 12, a plurality of input 2 are shown an input 2 terminal 1, an input 2 terminal 2, . . . , and an input 2 terminal n. Where n is an integer. A plurality of the control 1 and the control 2 are also shown.

Here, for simplicity of description, one of the pluralities of power amplifying unit 11a and the power amplifying unit 11a will be described another one as the power amplifying unit 11b. The amplifier device 41 comprises the power amplifying unit 11a and another power amplifying unit 11b. The power amplifying unit 11a includes the input amplifying unit 111a, the input switch unit 112a, and the grounded gate amplifying unit 113a.

The input amplifying unit 111a amplifies the input signal and outputs a first output signal.

The input switch unit 112a is connected in parallel with the input amplifying unit 111a, performs a switching operation according to an input signal, and outputs a switch output signal.

When the input amplifying unit 111a operates based on the type of the input signal, the grounded gate amplifying unit 113a amplifies the first output signal and outputs the second output signal. When the input switch unit 112a operates based on the type of the input signal, the grounded gate amplifying unit 113a amplifies the switch output signal and outputs the second output signal.

On the other hand, the other power amplifying unit 11b has another input amplifying unit 111b, another input switch unit 112b, and another grounded gate amplifying unit 113b.

The other input amplifying unit 111b amplifies the input signal and outputs another first output signal.

The other input switch unit 112b is connected in parallel with the other input amplifying unit 111b, performs a switching operation according to the input signal, and outputs another switch output signal.

When another first amplifying unit 111b operates based on the type of the input signal, another grounded gate amplifying unit 113b amplifies another first output signal and outputs another second output signal. When another input switch unit 112b operates based on the type of the input signal, another grounded gate amplifying unit 113b amplifies another switch output signal and outputs another second output signal.

The amplifier device 41 combines the second output signal and another second output signal and outputs the combined signal. It should be noted that a plurality of different power amplifying units 11b may exist.

The operation of the amplifier device 41 according to the fourth embodiment will now be described. In the following description, for the sake of simplicity, the transistor size is exemplified by connecting a plurality of transistors of the single size in parallel. Further, among the plurality of power amplifying unit 11a having the power amplifying unit 41a, the power amplifying unit 11a which becomes an operation state in the amplification operation an on-unit, the power amplifying unit 11a which becomes a stop state without an operation state referred to as an off-unit.

As shown in FIG. 13, the power amplifying unit 41a changes the number of the power amplifying units 11a to be turned on and put into an operation state, that is, the number of the on-units by changing the control signal input from the control 1 and the input signal input from the input 2 at the logic level. As a result, as shown in FIG. 14, the transmit power is controlled in each of the linear amplification operation and the switching amplifier operation.

In addition, the voltage of the control 2 of the power amplifying unit 11a which does not contribute to the amplification is given at a constant value, thereby protecting the transistor of the power amplifying unit 11a which does not contribute to the amplification.

Figure 15:
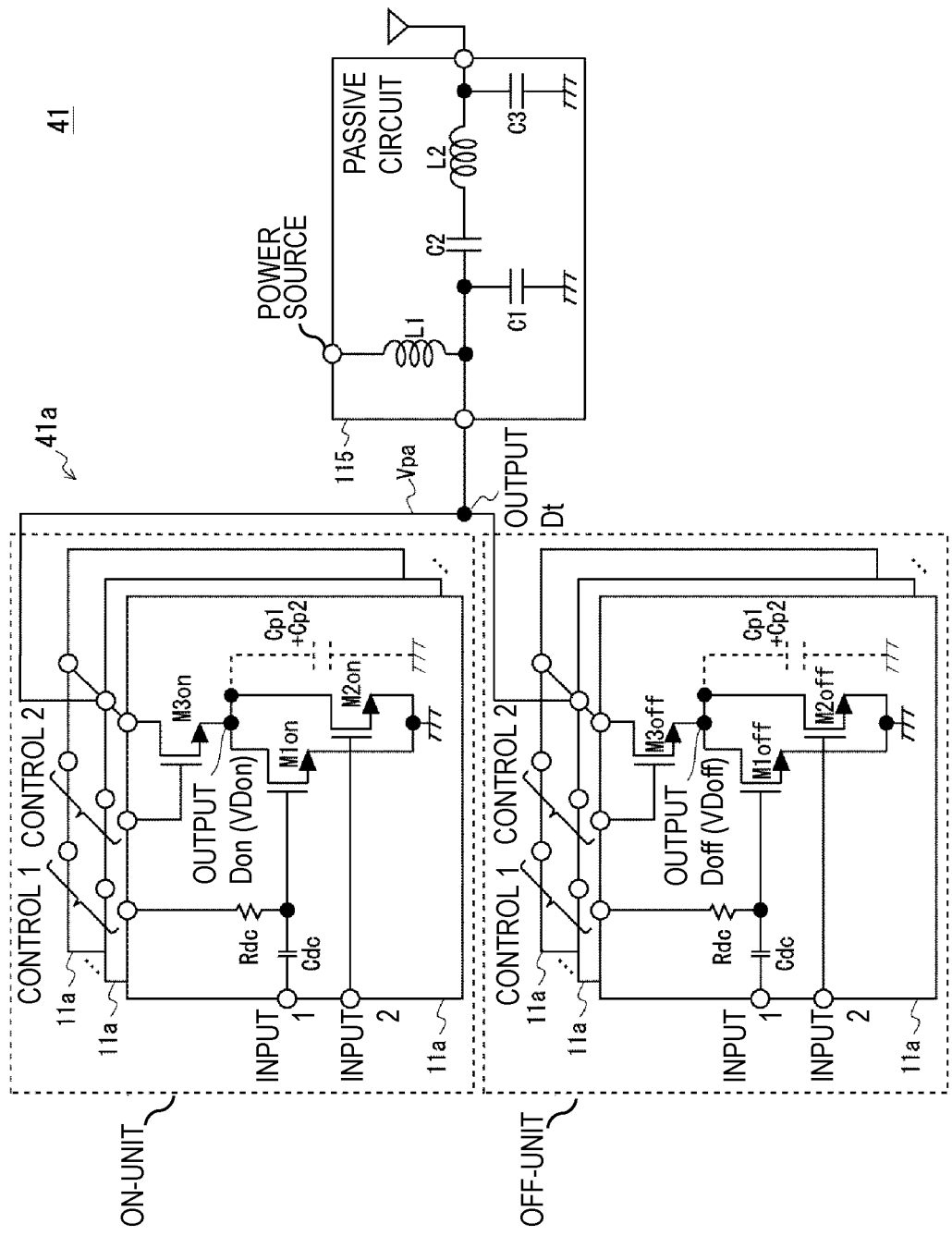
FIG. 15 is a circuit diagram illustrating the amplifier device according to the fourth embodiment.

FIG. 15 is a circuit diagram illustrating the amplifier device according to the fourth embodiment. FIG. 15 illustrates a plurality of power amplifying units 11a divided into the on-unit and the off-unit. FIG. 16 is a diagram illustrating the setting of amplifier device according to the fourth embodiment.

The voltage at an output Don of the on-unit is a voltage VDon, and the voltage at an output Doff of the off-unit is a voltage VDoff in FIG. 15. The voltage at an output Dt of the power amplifying unit 41a is referred to as a voltage Vpa. The on-unit and the off-unit functions are the same, and the transistors used are of the same specification. In each unit, the input 2, the control 1, and the control 2 of the power amplifying unit 11a are independent of each other.

As shown in FIG. 16, in the amplifier device 41, when the linear amplification operation is performed, the amplitude modulation signals are input to all the inputs 1, the Low level voltage is fixedly applied to all the inputs 2, and the Low level voltage is applied to the off-unit control 1 (step S101).

In the amplifier device 41, the first predetermined voltage Vg1, which is a bias voltage required for a transistor M1on to perform a linear operation, is applied to the control 1 of the on-unit, and the second predetermined voltage Vg2, which is the bias voltage for a transistor M3on to perform an amplification operation, is applied to the control 2 of the on-unit (a step S102). At this time, as the second predetermined voltage Vg2 to be applied to the control 2 of the on-unit, a voltage is selected in which the voltage VDon does not exceed the transistor M1on and the voltage between the terminals of a transistor M2on does not exceed the element breakdown voltage threshold voltage.

The bias voltage Vg2_off, which is a voltage for protecting the elements of a transistor M1off and a transistor M2off, is applied to the control 2 of the off-unit to limit the voltage VDoff in a step S103.

In step S101, step S102, and step S103, the linear amplification operation is performed with the plurality of on-units connected in parallel, and a signal obtained by amplifying the amplitude modulation signal, amplified signal for the input 1, is outputted from the power amplifying unit 41a.

The amplifier device 41, when performing a switching amplification operation, the constant envelope signal is input to the input 2 of the on-unit, the low-level voltage is applied at a fixed to the input 2 of the off-unit, the input 1 of the on-unit and the input 1 of the off-unit is no signal input (step S201). Further, the low-level voltage is applied to the control 1 of the on-unit and the control 1 the off-unit (step S201).

The third predetermined voltage Vg3 required for the transistor M3on to perform the switching amplifying operation is applied to the control 2 of the on-unit in a step S202. At this time, as the third predetermined voltage Vg3 to be applied to the control 2 of the on-unit, a voltage whose voltage VDon does not exceed the transistor M1on and whose voltage between the transistor M2on terminals does not exceed the device breakdown voltage is selected.

In addition, the bias voltage Vg3_off for protecting the elements of the transistor M1off and the transistor M2off is applied to the control 2 of the off-unit to limit the voltage VDoff.

The step S201, the step S202, and the step S203, the switching amplification operation is performed while the on-unit is connected in parallel a plurality. And the constant envelope signal amplified signal (amplified signal to the input 2) is output from the power amplifying unit 41a.

In the linear amplification operation of the amplifier device 41, the current flowing through one input amplifying unit does not change. In the amplifier device 41, a plurality of input amplifying units performs the same operation, so that the input amplifying units themselves operate in parallel. In the amplifier device 41, the current flowing through the transistors is increased by the amount of parallel, and the amplification factor of the input amplifying unit is increased by the amount of parallel. Increasing the number of on-units operating in parallel increases the transmission power, and decreasing the number of on-units operating in parallel decreases the transmit power. Thus, the amplifier device 41 can control the transmit power.

In the switching amplification of the amplifier device 41, the input switch unit of the power amplifying unit operates as a plurality of switches. At this time, since the switch of the power amplifying unit appears as a parallel connection of resistors, the on-resistance changes. As a result, the loss in the on-resistance changes, and the transmission power is controlled.

In the amplifier device 41, the transmit power may be adjusted by changing the power supply voltages. In addition, the transmit power may be controlled by combining the method of step S203 from step S201 with the method of changing the power supply voltages.

The effects of the fourth embodiment according to amplifier device 41 will be described. The amplifier device 41 can control the transmit power (output power) over a wide range by controlling (adjusting) the number of on-units.

The amplifier device 41 can limit the drain voltages of the transistors M1off and M2off so that a drain voltages of the transistors do not exceed the element breakdown voltage threshold (breakdown voltage limit) during the linear amplification operation and the switching operation by performing the step S103 and the step S203.

When the transmission power is controlled by a single power amplifying unit, there are limitations in the adjustment of the gate bias and the load. Therefore, in the amplifier device 41 according to the fourth embodiment, by connecting a plurality of power amplifying units in parallel, it is possible to control the transmit power in a wide range even if the gate bias is small and the load is constant.

Adjusting so as not to exceed the element breakdown voltage thresholds will now be described. FIG. 17 is a graph illustrating the relationship between the voltage of the control 2 and the voltage at the output D1 of the amplifier device according to the fourth embodiment. The horizontal axis of FIG. 17 indicates the voltage of the control 2, and the vertical axis VD indicates the voltage at the output D1, output Don or output Doff. Vpa on the vertical axis represents the voltage at the output Dt.

In first embodiment according to amplifier device 11, since it was a single power amplifying unit, there was no off-unit and only on-units in their respective modes of operation (linear amplification operation or switched amplification operation) had to be considered.

On the other hand, in the amplifier device 41 according to the fourth embodiment, the on-unit and the off-unit exist. Unlike the on-unit, the off-unit does not operate, so that no current flows. In fourth embodiment, the amplifier device 41 is such that the on-unit and the off-unit share the same output terminal. Therefore, in the amplifier device 41, when a large signal is output, the voltage Vpa of the large signal is applied to the output Doff through the parasitic capacitance of the grounded gate amplifying unit of the off-unit.

Since the control 2 is independent for each power amplifying unit, the control 2 can individually apply constant bias voltage Vg2_off, bias voltage Vg3_off, to the gates of the transistors M3off and apply to bias the outputs Doff. That is, the voltages of the output Doff can be limited and can be adjusted so as not to exceed the element breakdown voltage thresholds of the off-unit transistors.

Similar to second embodiment, the voltage of the control 2 used in the linear amplification operation and the switching amplifier operation differ. Therefore, the voltage value of the control 2 of the off-unit is also different. The voltage of the control 2 is as shown in FIG. 17 in consideration of the breakdown voltage of the grounded gate amplifying unit.

Figure 18:
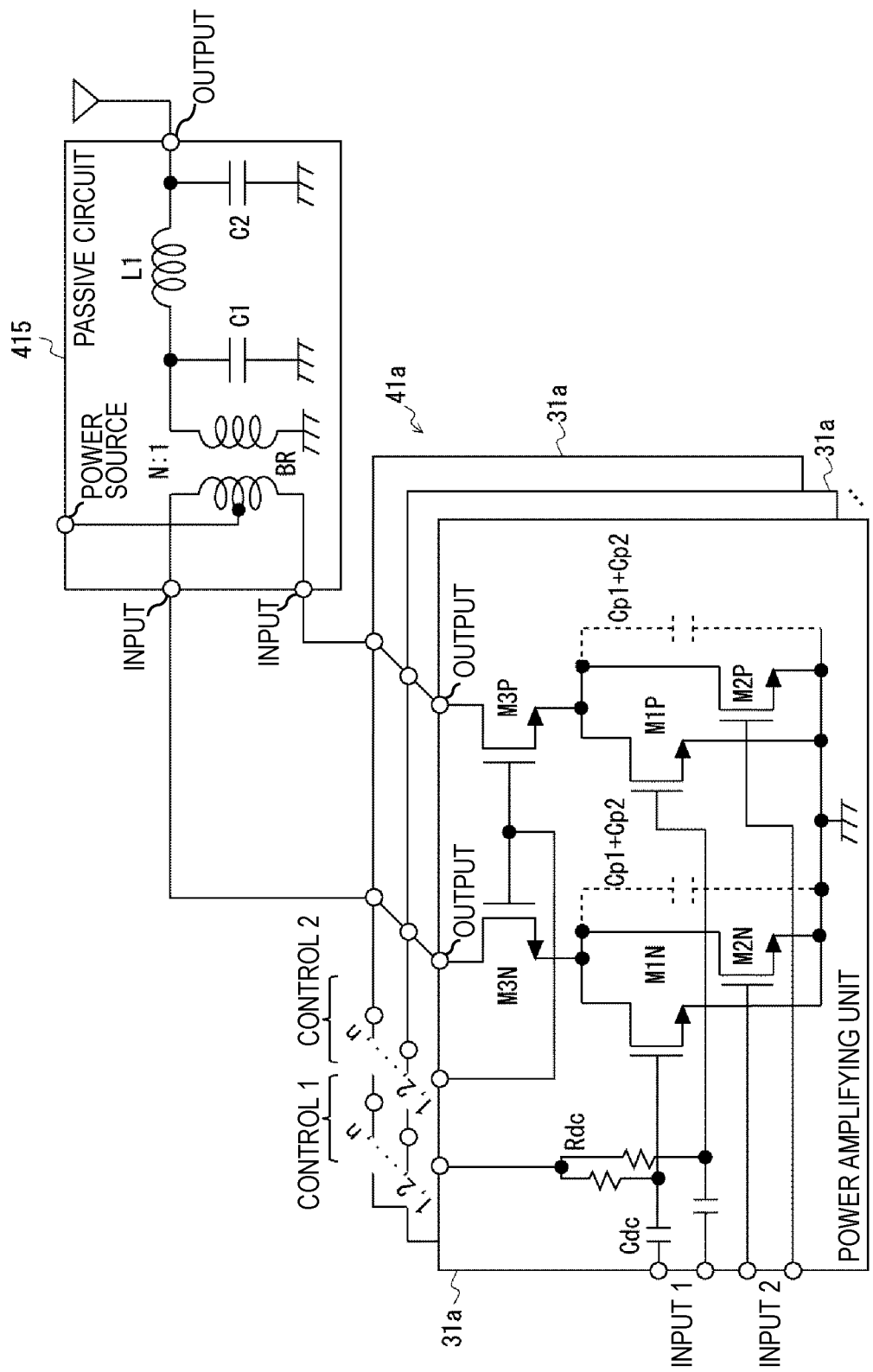
FIG. 18 is a circuit diagram illustrating the amplifier device according to the fourth embodiment.

The amplifier device 41 according to the fourth embodiment may correspond to differential signals. FIG. 18 is a circuit diagram illustrating a amplifier device according to fourth embodiment. FIG. 18 shows a circuit diagram in the case of a differential configuration.

As shown in FIG. 18, the power amplifying unit 41a in the case of the differential configuration connects a plurality of power amplifying units 31a in parallel. The power amplifying unit 31a includes the input amplifying unit, the input switch unit, and the grounded gate amplifying unit. The input amplifying unit includes the transistor M1N and the transistor M1P. The input switch unit includes the transistor M2N and the transistor M2P. The grounded gate amplifying unit includes the transistor M3N and the transistor M3P.

The differential outputs of the power amplifying units 41a in which the plurality of power amplifying units 31a are connected in parallel are all shared. The differential output of the power amplifying unit 41a is connected to the passive circuit 415. The passive circuit 415 includes the balun BR having a conversion ratio of N to 1, the inductive element L1, the capacitor element C1, and the capacitor element C2, and is a circuit for performing matching and waveform shaping.

Fifth Embodiment

Figure 19:
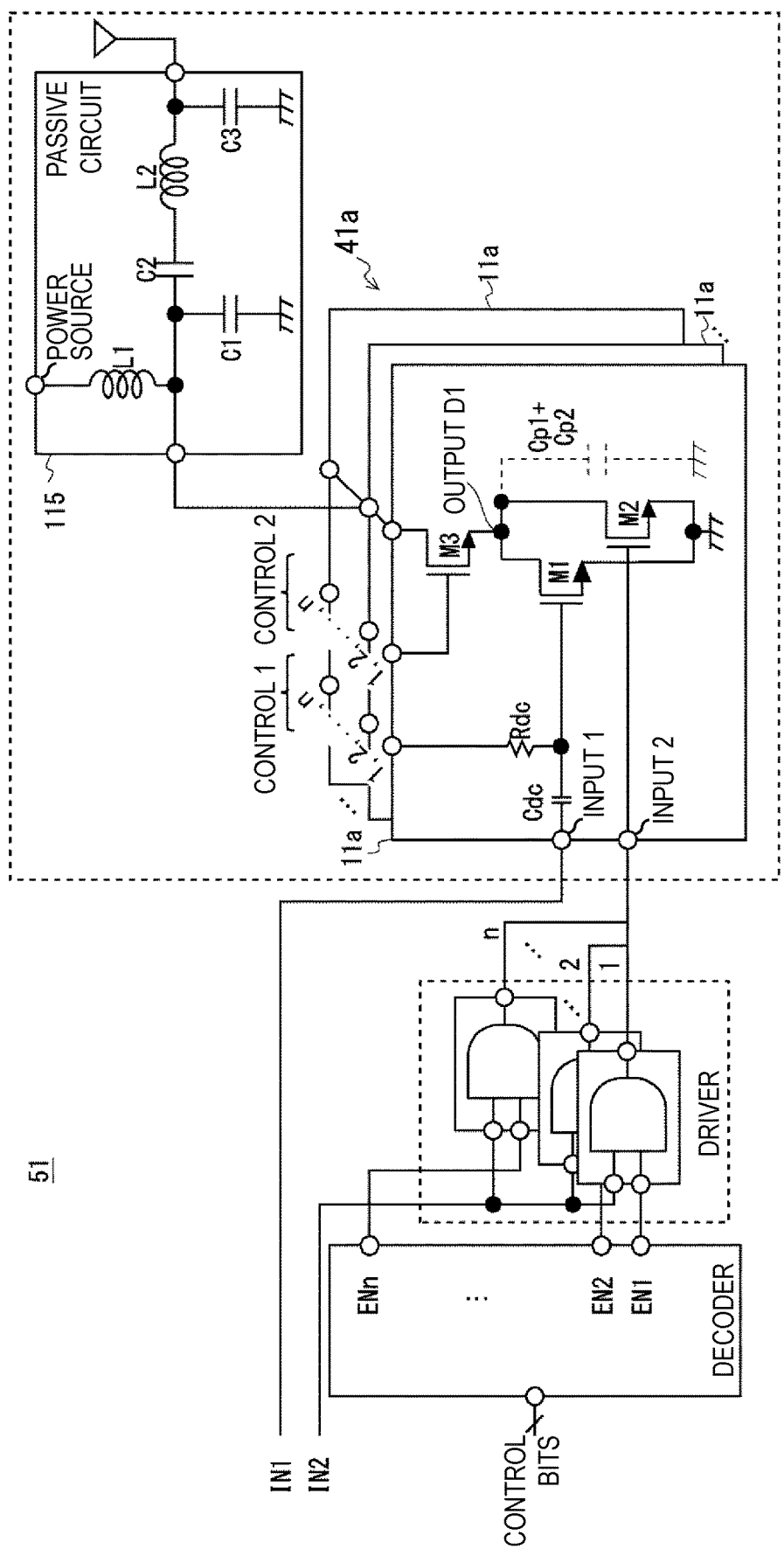
FIG. 19 is a circuit diagram illustrating the amplifier device according to a fifth embodiment.

FIG. 19 is a circuit diagram illustrating the amplifier device according to a fifth embodiment. The dotted line in FIG. 19 shows the power amplifying unit 41a and the passive circuit 115.

The amplifier device 51 according to fifth embodiment comprises decoders and drivers. The amplifier device 51 illustrates an exemplary configuration for controlling the inputs 2 of the plurality of power amplifying units 11a. An RF signal (constant envelope signal) of a constant envelope is inputted from the IN2, and the IN1 is constantly no signal (GND). The control 1 and the control 2 follow the control operation according to switching amplifying operation in the fourth embodiment refer to in FIG. 16.

The decoder is a circuit for converting a control bit into a control signal EN. The control bit is, for example, a value input by the user. The control signal EN is a logical signal and has a low state or a High state.

The driver has an AND circuit. The outputs of the decoders, from the control signal EN1 to a control signal ENn, are connected to one of the inputs of the AND-circuit. The IN2 is connected to the other of the inputs of the AND-circuit. Each of the outputs ANDed of the IN2 and each of the control signals EN are connected to the inputs 2 of each of the power amplifying units.

The decoders and the drivers according to the fifth embodiment may be part of a control unit to be described later.

FIG. 20 is a diagram illustrating the setting of the amplifier device according to the fifth embodiment. FIG. 20 shows an operation state of the input 2 with respect to the control signal EN.

As shown in FIG. 20, when the control signal EN is High, the RF signal is outputted from the driver and inputted to the input 2. When the control signal EN is Low, the driver shuts off the RF signal, and the input 2 is constantly Low regardless of the IN2. That is, the inputs 2 can be individually controlled by changing the control signal EN1 to ENn as the outputs of the decoders.

According to the fifth embodiment, the inputs 2 can be controlled, and the number of power amplifying units in performing the switching amplification can be changed.

Sixth Embodiment

Figure 21:
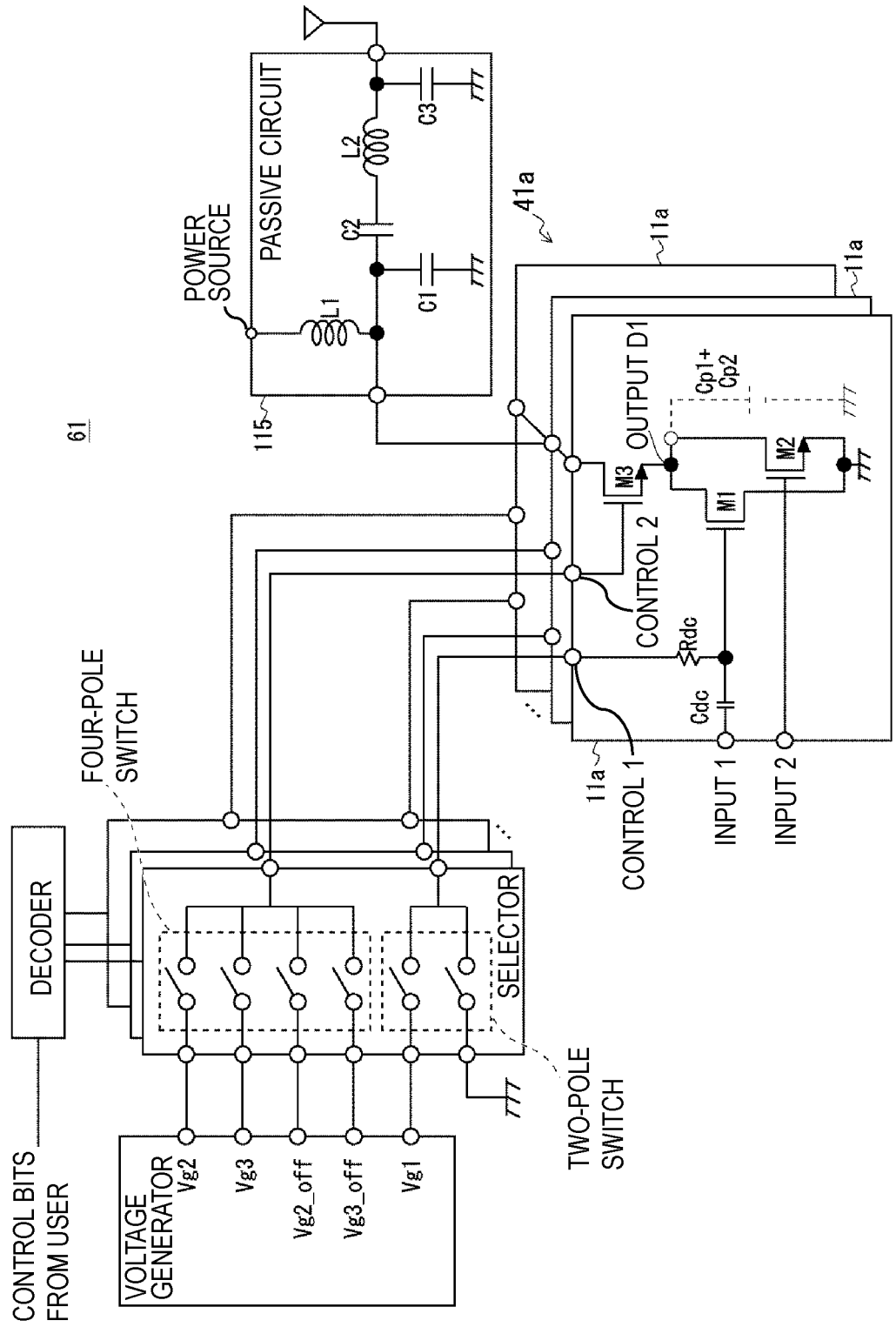
FIG. 21 is a circuit diagram illustrating the amplifier device according to a sixth embodiment.

FIG. 21 is a circuit illustrating an amplifier device according to a sixth embodiment. The amplifier device 61 according to the sixth embodiment includes the decoder, a voltage generator and a selector. The control 1 and control 2 follow the control operation according to switching amplifier operation in the fourth embodiment refer to in FIG. 16.

The voltage generator generates all the first predetermined voltage Vg1, the second predetermined voltage Vg2, the third predetermined voltage Vg3, the bias voltage Vg2_off, and the bias voltage Vg3_off required for the linear amplification operation and the switching amplifier operation. The decoder converts the control bits from the user.

The selector has a four-pole switch and a two-pole switch. The outputs of the four-pole switches are selected by the decoders from among the second predetermined voltage Vg2, the third predetermined voltage Vg3, the bias voltage Vg2_off, and the bias voltage Vg3_off, and inputted to the control 2. The outputs of the two-pole switches are selected from the first predetermined voltages Vg1 or the ground and inputted to the control 1.

Incidentally, the decoder and the selector and the voltage generating unit according to sixth embodiment may be part of the control unit to be described later.

According to the sixth embodiment, the control 1 and the control 2 are applied the voltage as shown in FIG. 16.

Seventh Embodiment

Figure 22:
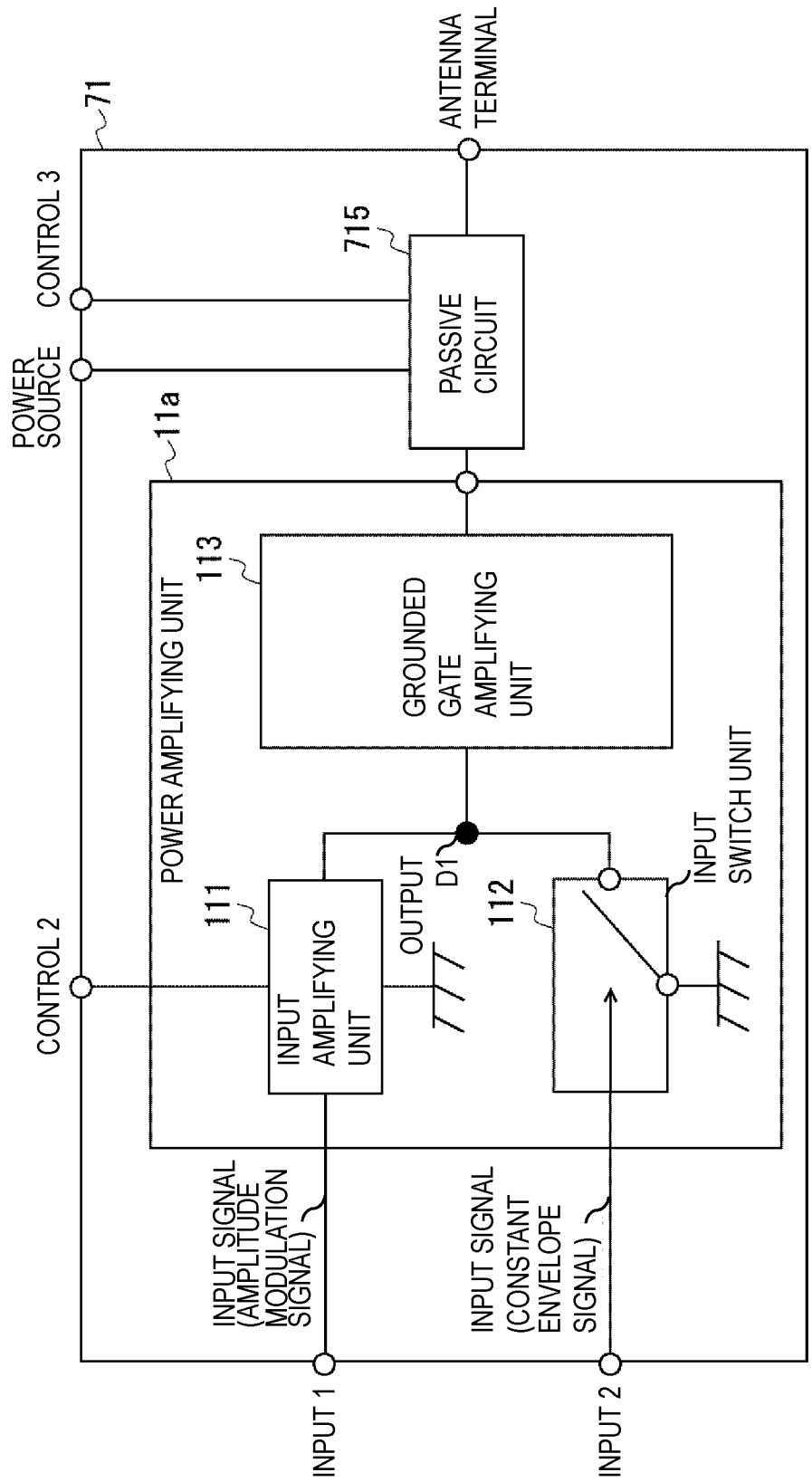
FIG. 22 is a block diagram illustrating the amplifier device according to a seventh embodiment.
Figure 23:
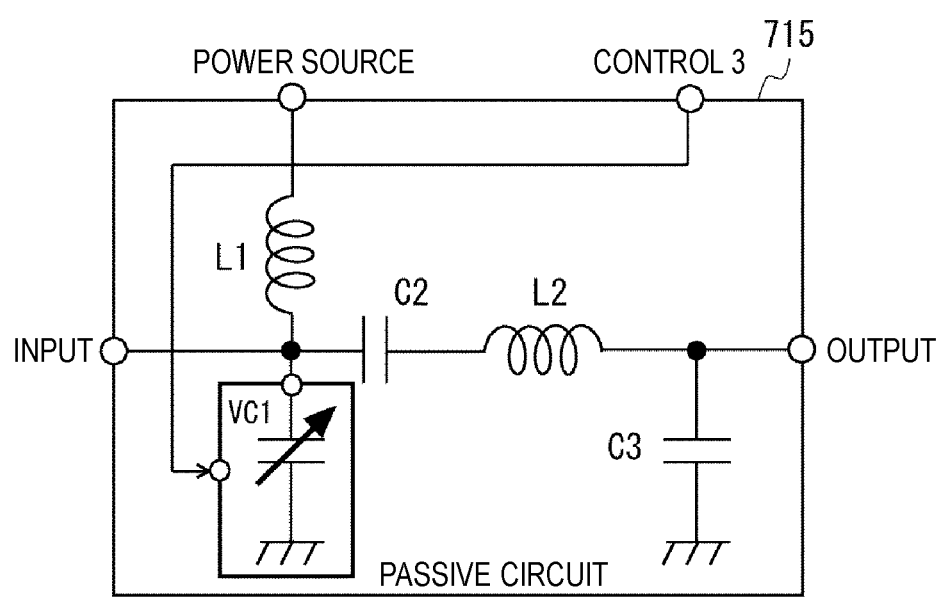
FIG. 23 is a circuit diagram illustrating the passive circuit according to the seventh embodiment.
Figure 24:
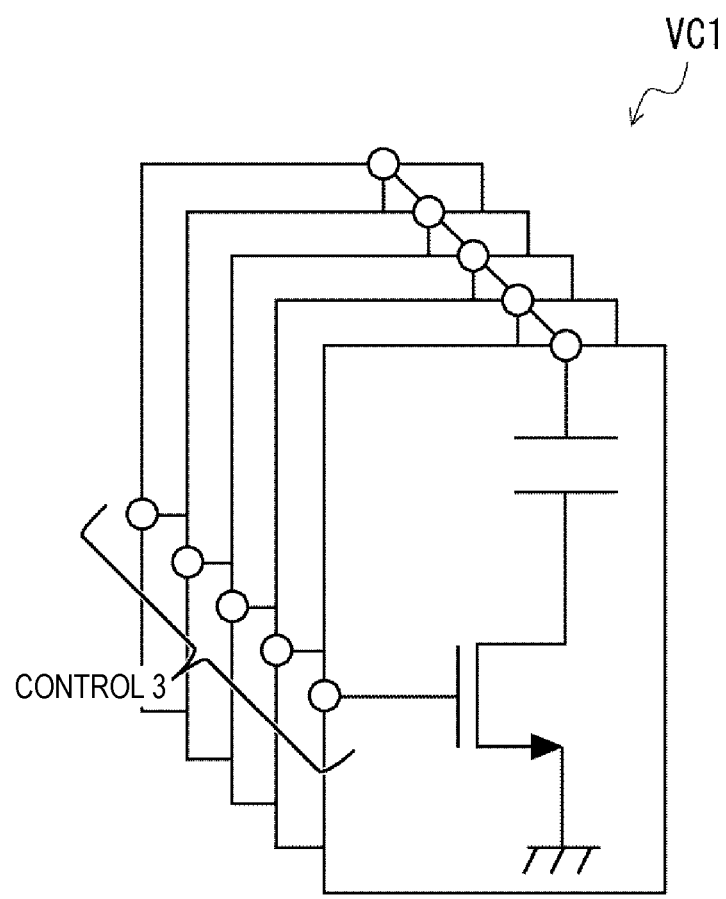
FIG. 24 is a circuit diagram illustrating a variable capacitor element according to the seventh embodiment.

FIG. 22 is a block diagram illustrating the amplifier device according to a seventh embodiment. FIG. 23 is a circuit diagram illustrating the passive circuit according to seventh embodiment. FIG. 24 is a schematic diagram illustrating an according to the variable capacitor element according to Embodiment 7.

As shown in FIG. 22, the amplifier device 71 according to the seventh embodiment, as compared with the amplifier device 11 according to first embodiment, differs in that the addition of control 3 to the passive circuit 715.

By adding the control 3 to the passive circuit 715, the impedance of the passive circuit 715 seen from the power amplifying unit 11a can be changed. Therefore, the impedance can be optimally controlled so as to maximize the power efficiencies in the linear amplification operation and the switching amplifier operation.

Specifically, as shown in FIG. 23, the capacitance values of the variable capacitor element VC1 are changed by the control signal from the control 3. The variable capacitor element VC1 can be realized by, for example, the circuits shown in FIG. 24.

In the amplifier device 71, the variable capacitor element VC1 is changed to control the impedance of the passive circuit 715 as viewed from the power amplifying unit 11a to the impedance at which the power efficiency is maximized in each of the linear amplification operation and the switching amplification operation. As a result, current consumption can be reduced.

Eighth Embodiment

Figure 25:
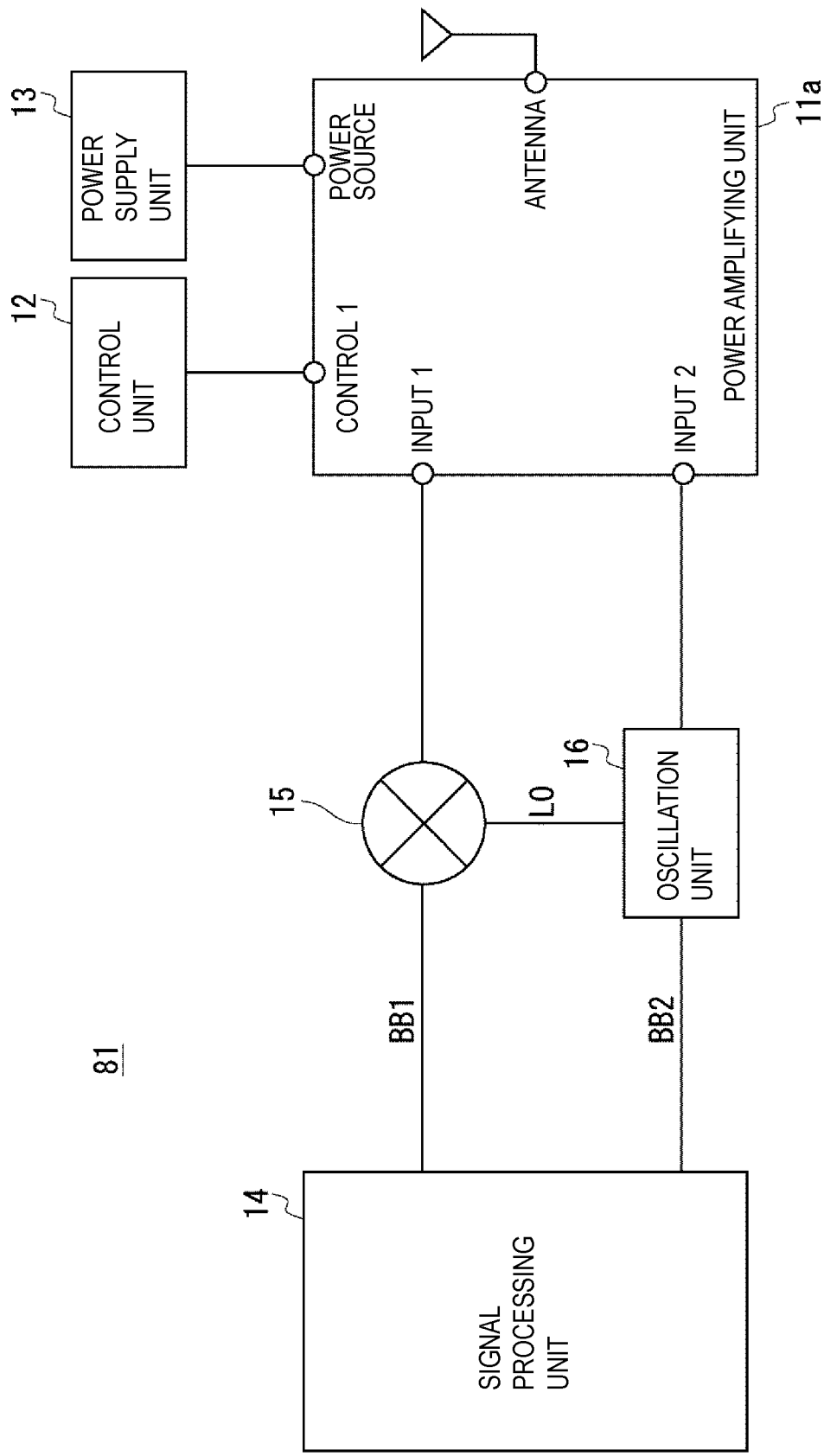
FIG. 25 is a block diagram illustrating the amplifier device according to an eighth embodiment.

FIG. 25 is a block diagram illustrating the amplifier device according to an eighth embodiment.

As shown in FIG. 25, the amplifier device 81 according to the eighth embodiment, as compared with the amplifier device 11 according to first embodiment, further comprising the control unit 12 and a power supply unit 13 and a signal processing unit 14 and a oscillation unit 16 and a mixer unit 15. The control unit 12 controls to operate the input amplifying unit 111 or the input switch unit 112 based on the type of the input signal.

The signal processing unit 14 determines which of signal path of the input 1 and the input 2 of the power amplifying unit 11a is to be used in accordance with the data input from the user and the data amount thereof. The signal processing unit 14 outputs a first baseband signal BB1 or a second baseband signal BB2 in accordance with the determined signal paths. That is, the signal processing unit 14 outputs the first baseband signal BB1 when it is determined to use the input 1 of the power amplifying unit 11a. Further, the signal processing unit 14 outputs the second baseband signal BB2, when it is determined to use the input 2 of the power amplifying unit 11a.

In case of the signal path of the input 1 is used, the power amplifying unit 11a inputs the first baseband signal BB1 to the mixer unit 15. The first baseband signal BB1 is a quadrature modulated signal with a data-containing amplitude modulation, and has a frequency of about several megahertz.

A high-frequency local signal LO from the oscillation unit 16 is input to the mixer unit 15. The mixer unit 15 mixes the high-frequency local signal and the first baseband signal BB1, and up-converts the first baseband signal BB1 to a first radio frequency signal RF1. The first radio frequency signal RF1 is input to the input 1 of the power amplifying unit 11a.

The power amplifying unit 11a appropriately amplifies the first radio frequency signal RF1 and transmits the signal from the antennas. When the signal is modulated by the OFDM method or the OQPSK method, the signal is transmitted by this method.

When the signal path of the input 2 is used, the power amplifying unit 11a inputs the second baseband signal BB2 to the oscillation unit 16. The oscillation unit 16 directly modulates the second baseband signal BB2, and outputs a second radio frequency signal RF2. The second radio frequency signal RF2 is input to the input 2 of the power amplifying unit 11a. The second radio frequency signal RF2 is a constant envelope signal.

The power amplifying unit 11a amplifies the second radio frequency signal RF2 with high efficiency and transmits the signal from the antennas. When the modulation scheme of the signal is the FSK scheme, the signal is transmitted in this method.

Incidentally, the mixer unit 15 is a circuit of the direct conversion method. The oscillation unit 16 is a circuit of a direct modulation system.

Ninth Embodiment

Figure 26:
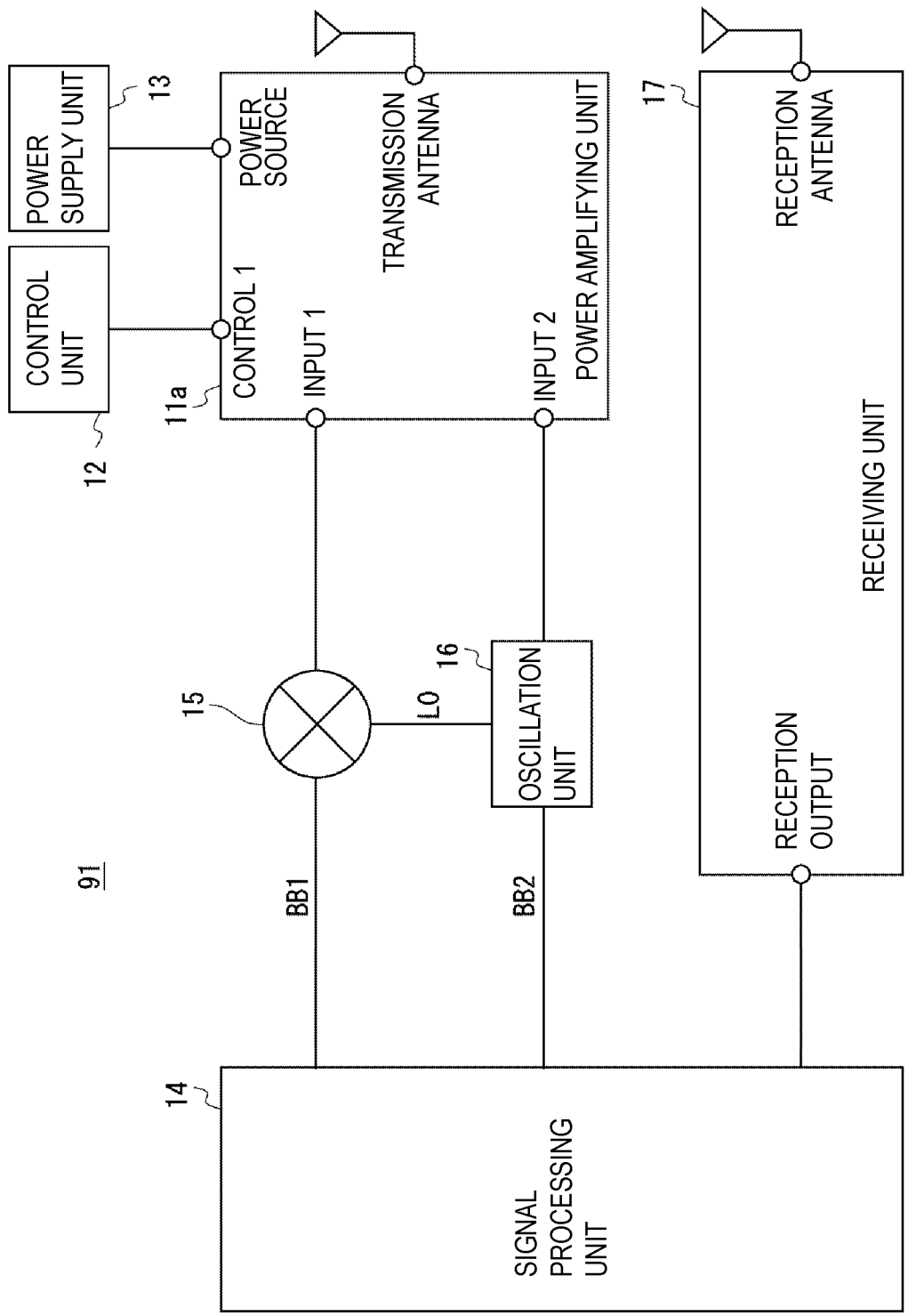
FIG. 26 is a block diagram illustrating the amplifier device according to a ninth embodiment.

FIG. 26 is a block diagram illustrating the amplifier device according to a ninth embodiment.

As shown in FIG. 26, the amplifier device 91 according to ninth embodiment differs from the amplifier device 81 according to eighth embodiment in that a receiving unit 17 is further provided.

The reception signal received by a reception antenna is appropriately amplified by the receiving unit, and a signal including data is extracted and output to a reception output. The signal processing unit 14 determines which of the signal paths of the input 1 and the input 2 of the power amplifying unit 11a is to be used in accordance with the data rate of the received signal and the data amount thereof, and outputs appropriate data to the first baseband signal BB1 and the second baseband signal BB2. The signal processing thereafter is the same as that in Embodiment 8.

Although a transmission antenna and the reception antenna are provided separately in Embodiment 9, the present invention is not limited thereto. An antenna for both transmission and reception may be substituted.

Although the invention made by the inventor has been specifically described based on the embodiment, the present invention is not limited to the embodiment already described, and it is needless to say that various modifications can be made without departing from the gist thereof.

What is claimed is:

1. Amplifier device comprising:
   a first amplifying unit for amplifying a first input signal and outputting a first output signal;
   an input switch unit for performing a switching operation by a second input signal and outputting a switch output signal; and
   a second amplifying unit for amplifying the first output signal or the switch output signal and outputting a second output signal,
   wherein the first input signal is an amplitude modulation signal, and when the first amplifying unit operates, the input switch unit stops operation, and
   wherein the second input signal is a constant envelope signal and when the input switch unit operates, the first amplifying unit stops operation.

2. The amplification device according to claim 1, further comprising:
   a control unit controlling the first amplifying unit and the input switch unit to operate based on the first input signal and the second input signal, respectively.

3. The amplification device according to claim 1, further comprising:
   a plurality of power amplifying circuits each including the first amplifying unit, the input switch unit, and the second amplifying unit,
   wherein all outputs of the plurality of power amplifier circuits are connected to an input of the passive circuit,
   wherein all inputs of the plurality of the first amplifying units are connected to a first input terminal,
   wherein all inputs of the plurality of input switch units are connected to a second input terminal,
   wherein when the first input signal is input from the first input terminal, i) a number of operations of the first amplifying units is controlled by a first control signal, and ii) a number of operations of the second amplifying unit is controlled by a second control signal,
   wherein when the second input signal is input from the second input terminal, i) the input switch unit is operated by the constant envelope signal, and ii) the number of operations of the second amplifying unit is controlled by the second control signal, and
   wherein a transmission power at an output terminal of the passive circuit is controlled to be at a predetermined level.

4. The amplification device according to claim 1, further comprising:
   a passive circuit for matching the second output signal.

5. The amplification device according to claim 1, wherein the first input signal, the first output signal, the second input signal, the switch output signal, and the second output signal are differential signals.

6. The amplification device according to claim 1,
   wherein the first amplifying unit includes a first transistor,
   wherein the input switch unit includes a second transistor,
   wherein the second amplifying unit includes a third transistor,
   wherein the first input signal is connected to a gate of the first transistor, and the second input signal is connected to a gate of the second transistor,
   wherein a source of the first transistor and a source of the second transistor are connected to ground,
   wherein a drain of the first transistor and a drain of the second transistor are connected to a source of the third transistor,
   wherein the second output signal is output from a drain of the third transistor,
   wherein with the first input signal:
   i) a first predetermined voltage is applied to the gate of the first transistor, such that the first amplifying unit operates; and
   ii) a low level voltage is applied to the gate of the second transistor, such that the input switch unit stops the operation, and
   wherein with the second input signal:
   i) the low level voltage is applied to the gate of the first transistor, such that the first amplifying unit stops operation, and
   ii) the input switch unit operates.

7. The amplification device according to claim 1,
   wherein the first amplifying unit includes a first transistor,
   wherein the input switch unit includes a second transistor,
   wherein the second amplifying unit includes a third transistor for linear amplification and a fourth transistor for switching amplification,
   wherein the first input signal is connected to a gate of the first transistor, and the second input signal is connected to a gate of the second transistor,
   wherein a source of the first transistor and a source of the second transistor are connected to ground,
   wherein a drain of the first transistor is connected to a source of the third transistor for linear amplification, and
   wherein a drain of the second transistor is connected to a source of the fourth transistor for switching amplification,
   wherein a drain of the third transistor for linear amplification is connected to a drain of the fourth transistor for switching amplification,
   wherein the second output signal is output from the drains of the third transistor and the fourth transistor,
   wherein with the first input signal:
   i) a first predetermined voltage is applied to the gate of the first transistor, such that the first amplifying unit operates; and
   ii) a low level voltage is applied to the gate of the second transistor, such that the input switch unit stops the operation, and
   wherein with the second input signal:
   i) the low level voltage is applied to the gate of the first transistor, such that the first amplifying unit stops operation, and
   ii) the input switch unit operates.

8. The amplification device according to claim 1,
   wherein the first amplifying unit includes a first transistor,
   wherein the input switch unit includes a second transistor,
   wherein the second amplifying unit includes a third transistor, wherein the first input signal is connected to a gate of the first transistor, and the second input signal is connected to a gate of the second transistor, wherein a source of the first transistor and a source of the second transistor are connected to ground, wherein a drain of the first transistor and a drain of the second transistor are connected to a source of the third transistor, wherein the second output signal is output from a drain of the third transistor, wherein with the first input signal:

i) a first predetermined voltage is applied to the gate of the first transistor such that the first amplifying unit operates;

ii) a second predetermined voltage is applied to the gate of the third transistor such that the second amplifying unit operates; and iii) a low level voltage is applied to the gate of the second transistor such that the input switch unit stops the operation, and wherein with the second input signal:

i) the low level voltage is applied to the gate of the first transistor such that the first amplifying unit stops the operation; and ii) a third predetermined voltage lower than the second predetermined voltage is applied to the gate of the third transistor such that the input switch unit and the second amplifying unit operate.

9. The amplification device according to claim 8, wherein the third predetermined voltage is a voltage value in which a peak voltage does not exceed a device withstand voltage threshold of the first transistor and the second transistor at the drain of the first transistor and the drain of the second transistor.

10. A method of signal amplification comprising:

linear amplification of a first input signal to output a first output signal;

switching amplification of a second input signal to output a switching output signal;

wherein the first input signal is an amplitude modulation signal, and the second input signal is a constant envelope signal.

* * * * *